United States Patent
Hamada

(10) Patent No.: US 10,153,006 B2
(45) Date of Patent: Dec. 11, 2018

(54) STACKED SEMICONDUCTOR DEVICE AND CONTROL METHOD FOR THE SAME

(71) Applicant: FUJITSU LIMITED, Kawasaki-shi, Kanagawa (JP)

(72) Inventor: Yusuke Hamada, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 82 days.

(21) Appl. No.: 15/283,624

(22) Filed: Oct. 3, 2016

(65) Prior Publication Data

US 2017/0110159 A1 Apr. 20, 2017

(30) Foreign Application Priority Data

Oct. 14, 2015 (JP) ................. 2015-202705

(51) Int. Cl.
*G11C 5/02* (2006.01)
*H01L 25/065* (2006.01)
*G11C 8/12* (2006.01)
*G11C 29/44* (2006.01)

(52) U.S. Cl.
CPC ............... *G11C 5/02* (2013.01); *G11C 5/025* (2013.01); *G11C 8/12* (2013.01); *H01L 25/0657* (2013.01); *G11C 2029/4402* (2013.01); *H01L 2224/16145* (2013.01); *H01L 2225/06513* (2013.01); *H01L 2225/06541* (2013.01); *H01L 2225/06555* (2013.01)

(58) Field of Classification Search
CPC ......... H01L 224/16145; H01L 25/0657; H01L 2225/06541; H01L 2224/16145; H01L 2224/16146; H01L 2224/16147; H01L 2224/16148; H01L 2225/06513; G11C 16/20; G11C 2029/4402
See application file for complete search history.

(56) References Cited

U.S. PATENT DOCUMENTS

| | | | | |
|---|---|---|---|---|
| 8,405,221 | B2* | 3/2013 | Imai | G11C 8/12 257/686 |
| 8,432,027 | B2* | 4/2013 | Foster, Sr. | H01L 25/0657 257/686 |
| 9,275,755 | B2* | 3/2016 | Kim | G11C 11/40615 |
| 2007/0057384 | A1 | 3/2007 | Alam et al. | |

(Continued)

FOREIGN PATENT DOCUMENTS

| JP | 2007-157266 | 6/2007 |
|---|---|---|
| JP | 2007-213654 | 8/2007 |

(Continued)

*Primary Examiner* — Tri Hoang
(74) *Attorney, Agent, or Firm* — Fujitsu Patent Center

(57) ABSTRACT

A semiconductor device includes semiconductor chips stacked each other. Each of the semiconductor chips converts second reception data received by second reception terminals arranged in point symmetry on the first face by a conversion method to convert first reception data received by first reception terminals arranged in point symmetry on the first face into a reference data; and generates an identification information of the each semiconductor chip based upon the converted second reception data; and outputs the bit sequence obtained by converting the generated identification information by means of the inverse conversion method of the conversion method.

13 Claims, 21 Drawing Sheets

(56) References Cited

U.S. PATENT DOCUMENTS

| | | | |
|---|---|---|---|
| 2007/0096332 A1* | 5/2007 | Satoh | H01L 23/481 |
| | | | 257/777 |
| 2007/0126105 A1 | 6/2007 | Yamada et al. | |
| 2008/0179728 A1 | 7/2008 | Ikeda | |
| 2011/0050320 A1 | 3/2011 | Gillingham | |
| 2011/0079924 A1* | 4/2011 | Suh | G11C 5/00 |
| | | | 257/777 |
| 2012/0126848 A1* | 5/2012 | Wu | G11C 5/02 |
| | | | 326/21 |

FOREIGN PATENT DOCUMENTS

| | | |
|---|---|---|
| JP | 2008-187061 | 8/2008 |
| JP | 2009-508357 | 2/2009 |
| JP | 2013-504183 | 2/2013 |
| WO | 2007/035234 | 3/2007 |
| WO | 2011/026218 | 3/2011 |

* cited by examiner

STACKED SEMICONDUCTOR DEVICE AND CONTROL METHOD FOR THE SAME

CROSS-REFERENCE TO RELATED APPLICATION

This application is based upon and claims the benefit of priority of the prior Japanese Patent Application No. 2015-202705, filed on Oct. 14, 2015, the entire contents of which are incorporated herein by reference.

FIELD

The embodiments discussed herein are related to a semiconductor device and a control method for a semiconductor device.

BACKGROUND

A stacked semiconductor device in which a plurality of semiconductor chips are stacked is a device that has been developed for increasing the degree of integration for semiconductor devices. In a stacked semiconductor devices, in many cases, a plurality of semiconductor chips with a similar structure (e.g., DRAM (Dynamic Random Access Memory)) are stacked (for example, refer to Japanese Laid-open Patent Publication No. 2007-157266, Japanese Laid-open Patent Publication No. 2007-213654, Japanese Laid-open Patent Publication No. 2008-187061, Japanese National Publication of International Patent Application No. 2013-504183, and Japanese National Publication of International Patent Application No. 2009-508357).

In such a stacked-type semiconductor device, a respective identification information (hereinafter, referred to as chip ID) is assigned to the each semiconductor chip for identifying each semiconductor chip. There have been proposed methods for assigning chip IDs (hereinafter, referred to as chip ID generation technique). In one method, 1 is added to the chip ID generated in a lower semiconductor chip to generate the chip ID of an upper layer semiconductor chip (for example, refer to Japanese Laid-open Patent Publication No. 2007-157266 and Japanese Laid-open Patent Publication No. 2007-213654). More specifically, in this case, the each semiconductor chip is respectively provided with an increment circuit, the increment circuit being connected in cascade. The increment circuit generates the chip ID respectively.

According to the chip ID generation technique, it is possible to assign the chip ID to the each semiconductor chip by the increment circuit. Accordingly, the each semiconductor chip may be allowed not to record a respective chip ID. Accordingly, each of the semiconductor chips may have the same structure as another. Thus, it is possible to manufacture the semiconductor chips by a common process, the common process allowing to provide advantageous stacked semiconductor devices in terms of production cost (for example, refer to Japanese Laid-open Patent Publication No. 2007-157266).

By the way, in order to improve heat dissipation characteristic in the stacked-type semiconductor devices, proposed is a technique in which a semiconductor chip is rotated and thereafter stacked on another (for example, refer to Japanese National Publication of International Patent Application No. 2009-508357).

SUMMARY

According to one aspect of the embodiments, a semiconductor device, in which a plurality of semiconductor chips are stacked each other, includes: first reception terminals of the plurality of the semiconductor chips, each of the first reception terminals being arranged in point symmetry on a first face; first transmission terminals of the plurality of the semiconductor chips, each of the first transmission terminals being arranged on a second face that is a back face of the first face, and each of the first transmission terminals lying over one of the first reception terminals of the plurality of the semiconductor chips in a plane view; and second reception terminals of the plurality of the semiconductor chips, each of the second reception terminals being arranged in point symmetry on the first face and the second reception terminals being different from the first reception terminals of the plurality of the semiconductor chips; wherein each of the plurality of the semiconductor chips includes second transmission terminals of the plurality of the semiconductor chips, the second transmission terminals being arranged on the second face and lying over the second reception terminals of the plurality of the semiconductor chips in a plane view; in a first case in which another semiconductor chip is arranged on the second face, the first transmission terminals of the plurality of the semiconductor chips are connected to the first reception terminals of the another semiconductor chip, and the second transmission terminals of the plurality of the semiconductor chips are connected to the second reception terminals of the another semiconductor chip; and a second reception data received by the second reception terminals is converted by a conversion method of a second case in which a first reception data received by the first reception terminals is converted into a reference data; an identification information of the each of the plurality of the semiconductor chips is generated based upon the converted second reception data; and a bit sequence is outputted from the second transmission terminals, the bit sequence being obtained in a third case in which the generated identification information is converted by an inverse conversion method to convert a data into another data by a time sequence that is an inverse of a time sequence of the conversion method.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Preferred embodiments will be explained with reference to accompanying drawings. Here, identical symbols are given to corresponding parts even in different drawings, and the description thereof will be omitted.

As described previously, according to the chip ID generation technique, it is possible to assign the chip ID to each semiconductor chip of the stacked semiconductor device by the increment circuit.

The each semiconductor chip of the stacked semiconductor device is provided with reception terminals and transmission terminals in order to perform transmission and reception of data between the semiconductor chips. In each semiconductor chip of such a stacked semiconductor device, for example, the data received by the reception terminals provided on a front face are processed by an internal circuit (e.g., a logic circuit) and then outputted from the transmission terminals provided on a back face.

Because of various reasons (e.g., ease of circuit design), the transmission and reception terminals of the internal circuit are arranged not to lie over each other in a plane view. When such semiconductor chips are directly stacked, transmission and reception terminals of the internal circuits are separated and not connected with each other. In order to avoid such a situation, it may be considered to rotate the upper semiconductor chip relative to the lower semiconductor chip so that the reception terminal of the upper semiconductor chip lies on or over the transmission terminal of the lower semiconductor chip, for example.

On the other hand, in the chip ID generation technique, transmission and reception terminals of the increment circuit are arranged to lie over each other in a plane view. Accordingly, when the semiconductor chip is rotated so that the transmission and reception terminals of the internal circuits are connected each other, the transmission and reception terminals of the increment circuits are disconnected.

It may be envisaged that the transmission terminals and the reception terminals of the increment circuits are each arranged in point symmetry, in order to avoid the separation between those two terminals due to rotation. In this case, however, the upper semiconductor chip will receive an erroneous chip ID from the lower semiconductor chip, because a bit sequence outputted from the lower semiconductor chip is changed because the upper semiconductor chip has already been rotated. Accordingly, the upper semiconductor chip may generate an incorrect chip ID.

According to the device disclosed herein, each of a plurality of semiconductor chips stacked each together may generate a correct identification information (e.g. identification number, the same applies hereafter) because the each semiconductor chip may eliminate the influence of chip rotation from the identification information received from the lower-side semiconductor chip.

Embodiment 1

(1) Structure (1-1) Terminal Arrangement and Circuit

Figure 1:
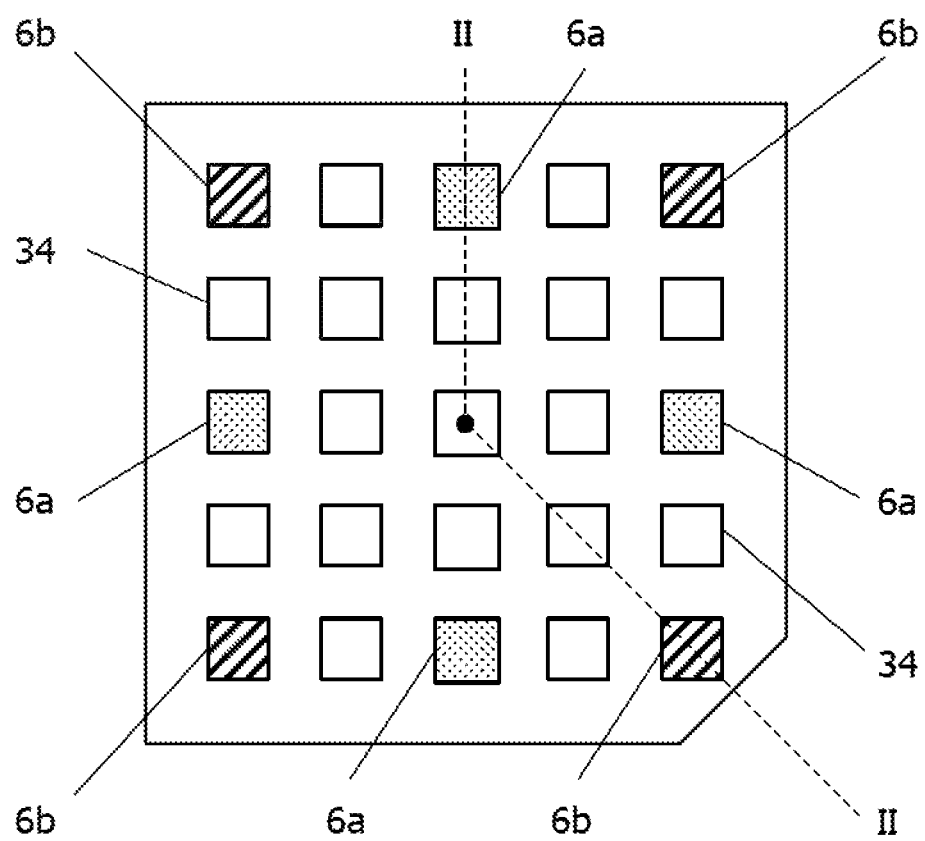
FIG. 1 illustrates a top view of the semiconductor device of the embodiment 1.
Figure 2:
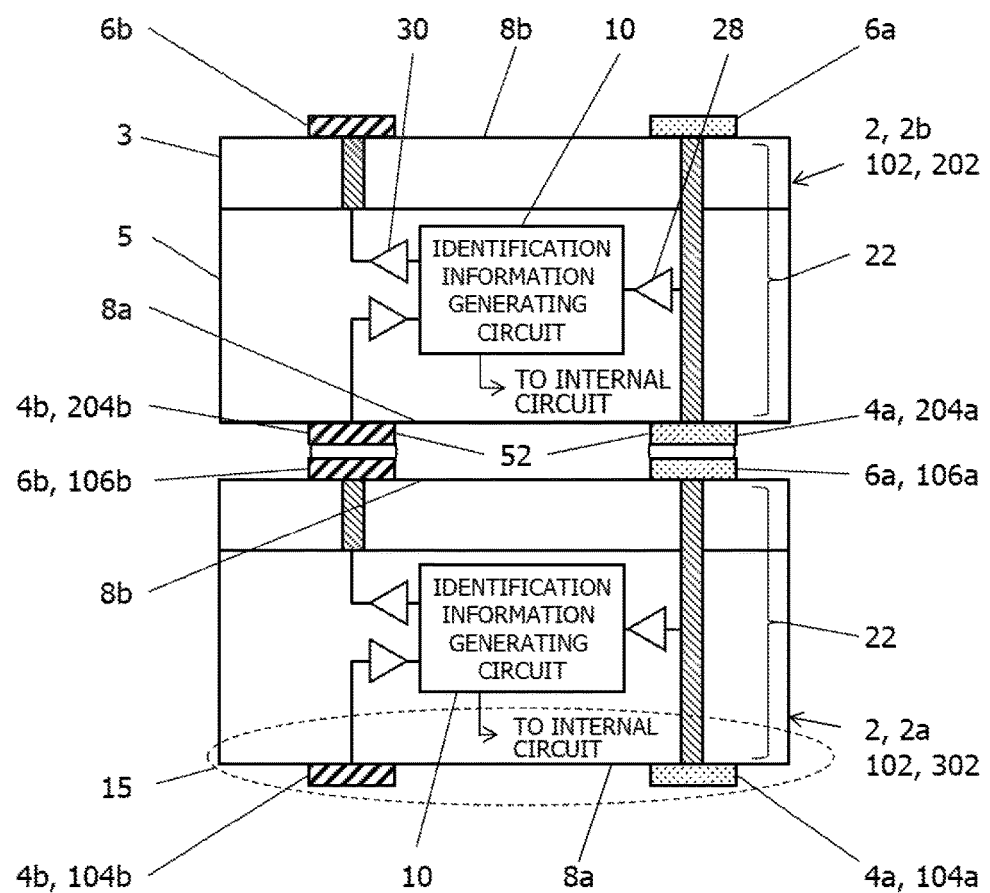
FIG. 2 is a cross-sectional view along II-II line of FIG. 1.
Figure 3:
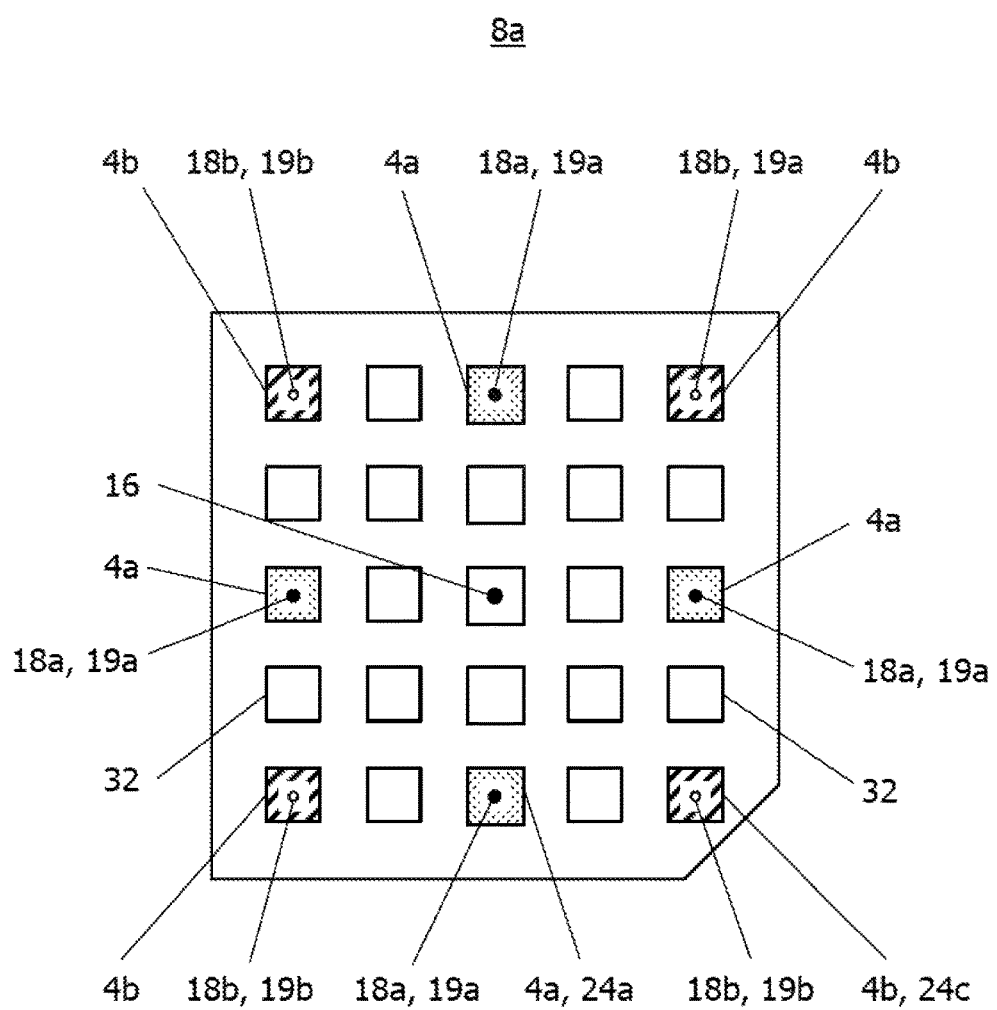
FIG. 3 is a diagram illustrating the terminal arrangement of the semiconductor device of the embodiment 1.
Figure 4:
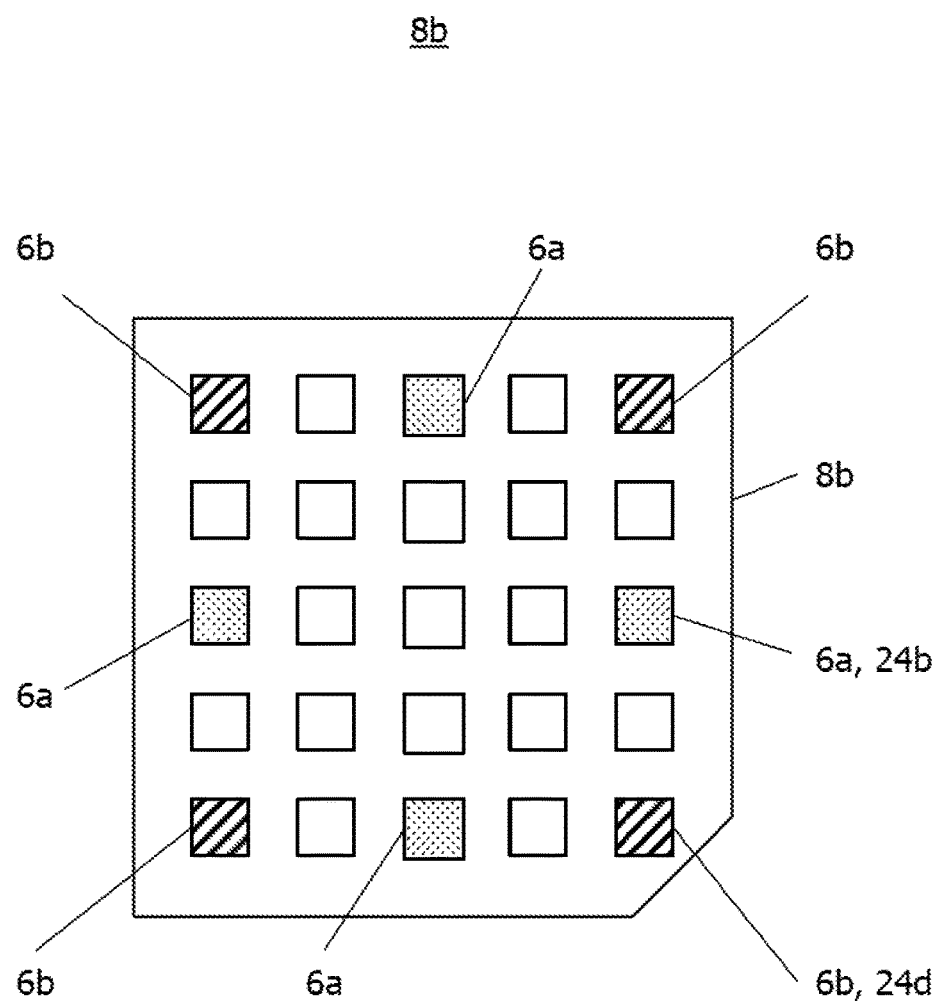
FIG. 4 is a diagram illustrating the terminal arrangement of the semiconductor device of the embodiment 1.
Figure 5:
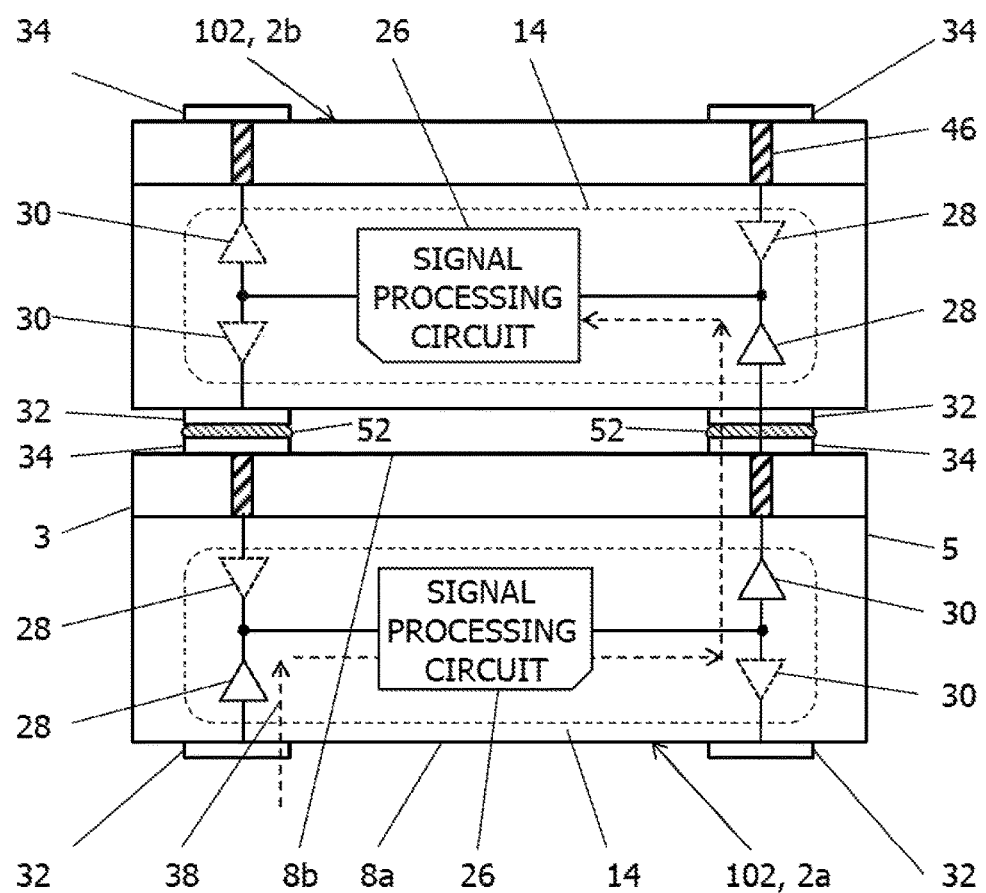
FIG. 5 is a cross-sectional view for explaining the control method of the embodiment 1.

FIG. 1 is a top view of the semiconductor device 12 according to the embodiment 1. FIG. 2 is a cross-sectional view along II-II line of FIG. 1. FIGS. 3 and 4 are cross-sectional views for explaining the terminal arrangement of semiconductor device 12. FIG. 5 is a cross-sectional view for explaining the control method of the embodiment 1.

The semiconductor device 12 of the embodiment 1 includes a plurality of semiconductor chips 2 that are stacked each together, as illustrated in FIG. 2. Each semiconductor chip 102 of the plurality of the semiconductor chips 2 includes, for example, a semiconductor substrate 3 (for example, a silicon substrate) and an integrated circuit formed on the front face side of the substrate 3.

In FIG. 2 and FIG. 5, parts of the integrated circuit of the each semiconductor chip 102 is depicted on a wiring layer 5. (similar illustrations are seen in FIGS. 5, 12, 16, and 20 to 21 that will be described later). FIG. 2 illustrates identification information generating circuits 10 and their buffers 28, 30 that are included in the integrated circuit of the each semiconductor chip 102. In FIG. 5, illustrated are internal circuits 14 included in the integrated circuit of the each semiconductor chip 102.

As illustrated in FIG. 2, each of the plurality of the semiconductor chips 2 includes a plurality of first reception terminals 4a arranged on the first face 8a of the each semiconductor chip 2. Further, each of the plurality of the semiconductor chips 2 includes a plurality of first transmission terminals 6a arranged on the second face 8b that is the back face of the first face 8a (i.e. the opposite face against the first face 8a). Each of the plurality of the semiconductor chips 2 further includes a plurality of second reception terminals 4b arranged on the first face 8a. Each of a plurality of semiconductor chips 2 further includes a plurality of second transmission terminals 6b arranged on the second face 8b.

FIG. 3 is a view of the first face 8a of the each semiconductor chip 102 seen from the lower side of FIG. 2. FIG. 4 is a view of the second face 8b of the each semiconductor chip 102 seen from the upper side of FIG. 2.

As illustrated in FIG. 3, each of the plurality of the first reception terminals 4a includes a point 18a (hereinafter, referred to as internal point 18a). Internal points 18a are arranged in point symmetry (i.e., in rotation symmetry) on the first face 8a. The plurality of the first transmission terminals 6a lie over the plurality of the first reception terminals 4a in a plane view as illustrated in FIG. 2 and FIG. 4. The plurality of the first transmission terminals 6a may partially lie over the plurality of the first reception terminals 4a in a plane view.

As illustrated in FIG. 3, each of the plurality of the second reception terminals 4b includes a point 18b (hereinafter, referred to as internal point 18b). Internal points 18b are arranged in point symmetry on the first face 8a. The plurality of the second reception terminals 4b are different from the plurality of the first reception terminals 4a. The plurality of the second transmission terminals 6b are arranged on the second face 8b and lie over the plurality of the second reception terminals 4b in a plane view, as illustrated in FIG. 2 and FIG. 4. The plurality of the second transmission terminals 6b may partially lie over the plurality of the second reception terminals 4b in a plane view.

In a certain case, the each semiconductor chip 102 (see FIG. 2) is stacked with another semiconductor chip 202 of the plurality of the semiconductor chips 2 in a certain state. In the above certain case, the above another semiconductor chip 202 is arranged on the second face 8b of the above semiconductor chip 102. In the above certain state, the plurality of the first transmission terminals 106a of the above semiconductor chip 102 (302) are connected to the plurality of the first reception terminals 204a of the above another semiconductor chip 202. In this state, the plurality of the second transmission terminals 106b of the above semiconductor chip 302 are connected to the plurality of the second reception terminals 204b of the above another semiconductor chip 202.

The plurality of the first reception terminals 4a are, for example, pad-shaped electrodes each of which is provided at one end of a through electrode 22 that passes through one of the semiconductor chips 102. The plurality of the first transmission terminals 6a are, for example, another pad-shaped electrodes, each of which is provided at the other end of the through electrode 22.

The internal points 18a (see FIG. 3) of the plurality of the first reception terminals 4a preferably have a rotation center 16 identical to that of the internal points 18b of the plurality of the second reception terminals 4b. When the semiconductor chip 102 is rotated by a certain angle around the rotation center 16, the plurality of the first reception terminals 4a after the rotation lie over the plurality of the first reception terminals 4a before rotation. The same result may be obtained for the plurality of the second reception terminals 4b. Accordingly, even when another semiconductor chip 202 on the second face 8b is rotated by the above certain angle, the plurality of the first reception terminals 204a of another semiconductor chip 202 and the plurality of the first transmission terminals 106a of the semiconductor chip 102 (302) may be connected. The same situation may be obtained for the relationship between the second reception terminals 204b of another semiconductor chip 202 and the second transmission terminals 106b of the semiconductor chip 102 (302).

Coincidence of the rotation center 16 of the plurality of the first reception terminals 4a and the plurality of the second reception terminals 4b may also be described as follows.

The plurality of the first reception terminals 4a (see FIG. 3) includes a plurality of the first points 19a arranged in point symmetry around a point 16 on the first face 8a. The plurality of the second reception terminals 4b includes a plurality of the second points 19b. The second points 19b are arranged in point symmetry around the above mentioned point 16 and are different from the plurality of the first points 19a. This means that the rotation center of the plurality of the first reception terminals 4a and the rotation center of the plurality of the second reception terminals 4b coincide. In the example of FIG. 3, the first points 19a are the internal points 18a of the plurality of the first reception terminals 4a, and the second points 19b are the internal points 18b of the plurality of the second reception terminals 4b.

The each semiconductor chips 102 further includes an identification information generating circuit 10 (see FIG. 2) that generates the identification information (for example, identification number) of the each semiconductor chips 102. The identification information generating circuit 10 is, for example, a logic circuit. The detail of the identification information generating circuit 10 will be described later.

The each semiconductor chip 102 further includes an internal circuit 14 (see FIG. 5) that operates based upon the identification information. The internal circuit 14 includes an input buffer 28, a signal processing unit 26 and an output buffer 30. The signal processing unit 26 is, for example, a CPU (Central Processing Unit), a logic circuit, or a memory (e.g., dynamic random access memory), and the like.

The signal processing unit 26 is connected to an electrode 32 on the first face 8a side or to an electrode 34 on the second face 8b side through, for example, an input buffer 28. The signal processing unit 26 is further connected to an electrode 32 side on the first face 8a or to an electrode 34 on the second face 8b side through an output buffer 30. How to control the input buffer 28 and the output buffer 30 will be described later.

As is described in FIGS. 1 to 5, the structure of the each semiconductor chip 102 according to the embodiment 1 is one (i.e., the same structure). That means that the design of the each semiconductor chip 102 is an identical one.

Thus, easy are the commonalizing of the design and the manufacturing of the semiconductor chip 102. The commonalizing improves the yield of the semiconductor chip 102.

(1-2) Identification Information Generating Circuit

Figure 6:
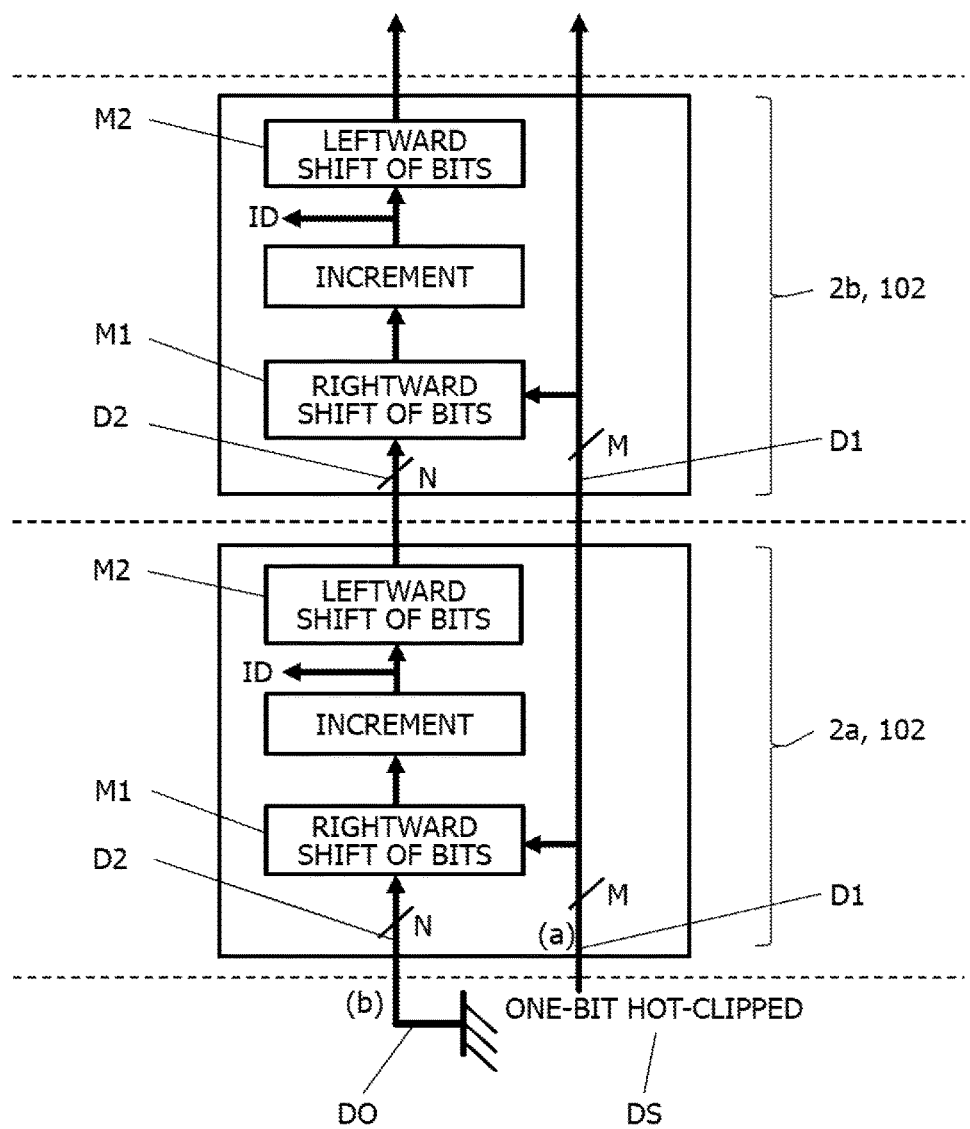
FIG. 6 is an example of a logic connection diagram of an identification information generating circuit.
Figure 7:
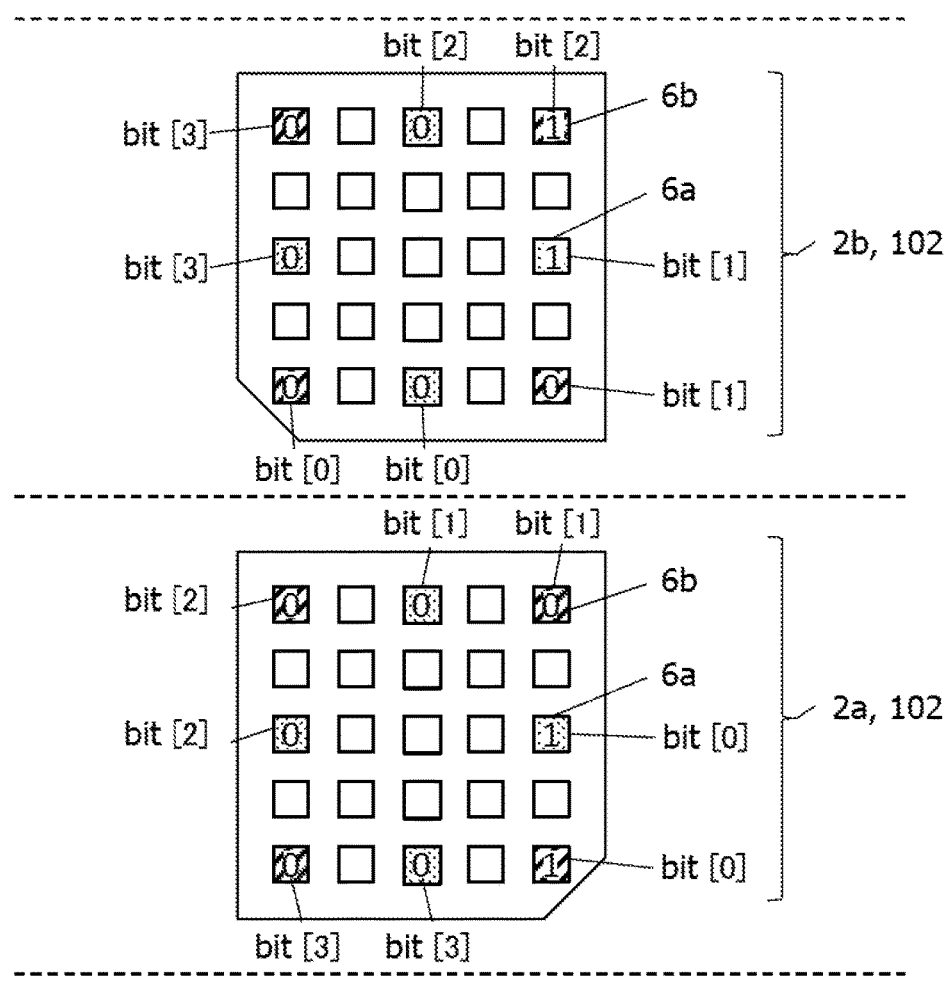
FIG. 7 is an example of the implementation view of the identification information generating circuit.
Figure 8:
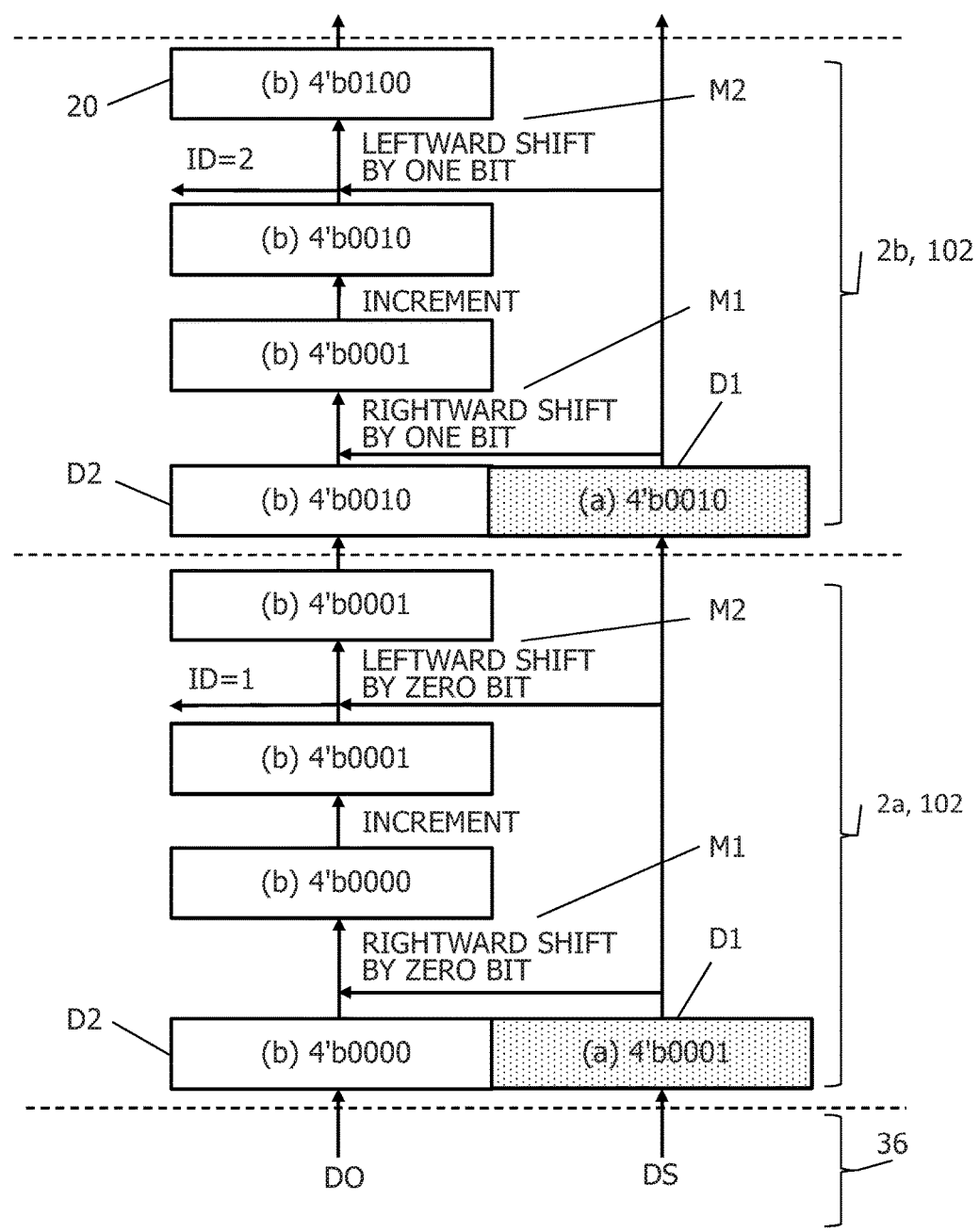
FIG. 8 is a diagram illustrating an example of signal processing by the identification information generating circuit.

FIG. 6 is an example of a logic connection diagram of the identification information generating circuit 10. FIG. 7 is an example of an implementation diagram of the identification information generating circuit 10. FIG. 8 describes an example of the signal processing performed by the identification information generating circuit 10.

On the lower side of FIG. 6, the logic performed on the first-layer semiconductor chip (hereinafter, referred to as a first semiconductor chip 2a) of the plurality of the semiconductor chips 2 is described. On the upper side of FIG. 6, the logic performed on the second-layer semiconductor chip (hereinafter, referred to as a second semiconductor chip 2b) of the plurality of the semiconductor chips 2 is described. Similar representation method is applied to FIGS. 7 and 8.

Referring to FIG. 6, "a" indicates the data relating to the plurality of the first reception terminals 4a (or, the plurality of the first transmission terminals 6a), and "b" indicates a data relating to the plurality of the second reception terminals 4b (or, the plurality of the second transmission terminals 6b). "/N" indicates that a length of a data is N bit, and "/M" indicates that a length of a data is M bit. In the first embodiment, N, M=4. The same notations are used in FIGS. 7 and 8. The operation of the identification information generating circuit 10 will be described below referring to FIGS. 6 to 8.

A reference data DS (for example, a binary number "0001") is inputted into the plurality of the first reception terminals 104a arranged on one end 15 of the semiconductor device 12, as illustrated in FIGS. 6 and 8. A data DO that is a source of the identification information ID is inputted into the plurality of the second reception terminals 104b arranged on the one edge 15 of the semiconductor device 12. Here, a numerical character enclosed by " " denotes a binary number hereafter, and another numerical character denotes a decimal number hereafter.

—Reference Data, and Source Data for Identification Information—

The reference data DS enables detection of the rotation angle of another semiconductor chip (e.g., the second semiconductor chip 2b) relative to the first semiconductor chip 2a. The reference data is, for example, a data that changes into different data by bit shift in which a value (i.e., "0" or "1") of each bit is shifted towards the most significant bit side and a binary number (e.g., "0") overflowed from the most significant bit side is moved into an empty bit or empty bits that occurs on the least significant bit side. The reference data is, for example, a binary number "0001" in which the least significant bit is "1" and other bits are "0". In this case, the binary number that is overflowed from the most significant bit side and moved into the empty bit on the least significant bit side is "0" when one digit is shifted in the reference data DS. A binary number that is overflowed and moved into empty bits is "00" when two digits are shifted. The reference data DS is neither "0000" nor "1111". The reference data DS may be, for example, a binary number "0011".

The data DO, a source from which an identification information ID is generated, is a binary number each bit (digit) of which is "0" (see FIG. 8), for example. The reference data DS and the data DO are fed from the circuit board 36 on which the semiconductor device 12 is mounted, for example.

In practice, for example, among the plurality of the first reception terminals 4a, a terminal corresponding to the least significant bit is connected to a power source potential of the circuit board 36. The other terminals of the plurality of the first reception terminals 4a are connected to a ground line of the circuit board 36. According to this connection, the reference data "0001" is inputted.

Each terminal of the plurality of the second reception terminals 4b is, for example, connected to the ground line of the circuit board 36 (see FIG. 6). By this connection, inputted is a data "0000" that is a source of the identification information ID.

—Conversion of Second Reception Data—

When the identification information generating circuit 10 of the each semiconductor chip 102 receives the first reception data D1 with the plurality of the first reception terminals 4a, the identification information generating circuit 10 identifies the bit-shifting method M1 for converting the first reception data D1 to the reference data DS. The identification information generating circuit 10 then converts the second reception data D2 by shifting each bit thereof, which is received with the plurality of the second reception terminals 104b, according to the identified bit-shifting method M1.

The conversion method M1 of bits is, for example, a method in which the second reception data D2 is shifted rightward by m1 bit (m1 is an integer) when the first reception data D1 includes a bit having a bit value of "1" at m1-th bit counted from the least significant bit. In this case, the identification information generating circuit 10 identifies the number m1.

In the example illustrated in FIG. 8, the reference data is "0001". Meanwhile, the first reception data D1 received by the first semiconductor chip 2a is "0001" (i.e., reference data DS). Accordingly, the identification information generating circuit 10 of the first semiconductor chip 2a identifies "0-bit rightward shift" as the bit shifting method M1 (see FIG. 8).

In the example illustrated in FIG. 8, the second reception data D2 received by the first semiconductor chip 2a is "0000" (the data DO that is a source of the identification information). Accordingly, the identification information generating circuit 10 of the first semiconductor chip 2a converts this second reception data "0000" to "0000" by applying 0-bit rightward shift principle. That is to say, the second reception data D2 is not substantially converted in the first semiconductor chip 2a.

—Generation of Identification Information—

The identification information generating circuit 10 of the each semiconductor chip 102 further generates the identification information ID for the each semiconductor chip 102 based upon the converted second reception data D2. In the example of FIG. 8, the first semiconductor chip 2a generates the identification information of the first semiconductor chip 2a by adding (giving an increment) a certain value to "0000" that is a converted reception data D2. In the example of FIG. 8, the certain value is 1. The identification information to be generated is 1. The certain value may be other than 1 (e.g., 2).

—Inverse Conversion and Output of Identification Information—

The identification information generating circuit 10 of the each semiconductor chip 102 converts the generated identification information ID by an inverse conversion M2 of the above bit-shifting method M1. Thereafter, the identification information generating circuit 10 of the each semiconductor chip 102 outputs the converted ID from a plurality of the second transmission terminals 6b. Here, the inverse conversion M2 is a bit-shift method that enables the reference data DS to be converted to the first reception data D1.

As described above, in the example of FIG. 8, the reference data DS and the first reception data D1 are both "0001". Accordingly, the inverse conversion M2 in the first semiconductor chip 2a is a 0-bit leftward shift (i.e., no conversion occurs). Thus, the identification information generating circuit 10 of the first semiconductor chip 2a applies the 0-bit leftward shift to the generated identification information "0001" and thereafter outputs the 0-bit leftward shifted identification information "0001" from the plurality of the second transmission terminals 106b.

The identification information generating circuit 10 may use the m1 identified in the conversion method M1 as a leftward shift amount (i.e., m2) of the inverse conversion M2, for example.

—Output of First Reception Data—

The each semiconductor chip 102 further outputs the first reception data D1 from the plurality of the first transmission terminals 6a. In the example of FIG. 8, the first semiconductor chip 2a outputs the first reception data "0001" from the plurality of the first transmission terminals 106a (see FIG. 2).

By the way, the n1-th bit of the first reception data D1 (n1 is an integer) is received at a terminal 24a (hereinafter, referred to as the first terminal) of the plurality of the first reception terminals 4a (see FIG. 3). A n1-th bit of the data outputted from the plurality of the first transmission terminals 6a is outputted from a terminal 24b (hereinafter, referred to as the second terminal) lying over the first terminal 24a in a plan view, the terminal 24b being one of the plurality of the first transmission terminals 6a. The number n1 is an integer equal to or greater than 0 and smaller than the number of the first reception terminals 4a.

For one example, the first reception data D1 of the first semiconductor chip 2a is "0001" (see FIG. 8), and the bit value "1" of the 0-th bit is received by the first reception terminal 24a illustrated in FIG. 3. The first data D1 outputted from the plurality of the first transmission terminals 106a of the first semiconductor chip 2a is "0001", and the bit value "1" of the 0-th bit thereof is outputted from the second terminal 24b (see FIG. 4) that lies over the first terminal 24a in a plane view.

By the way, FIG. 3 is a bottom view of the first semiconductor chip 2a, and FIG. 4 is a top view of the first semiconductor chip 2a. Accordingly, when each bit of the first reception data D1 is assigned clockwise to the plurality of the first reception terminals 4a, the each bit of the data is outputted counter-clockwise from the plurality of the first transmission terminals 6a. Thus, the position of the first terminal 24a in FIG. 3 and the position of the second terminal 24b in FIG. 4 are different.

Similarly, the n2-th bit of the second reception data D2 (n2 is an integer) is received at a terminal 24c (hereinafter, referred to as the third terminal) of the plurality of the second reception terminals 4b (see FIG. 3). The n2-th bit of the data outputted from the plurality of the second transmission terminals 6b is outputted from a fourth terminal 24d lying over the third terminal 24c in a plane view, the fourth terminal 24d being one of the plurality of the second transmission terminals 6b (see FIG. 4). The number n2 is an integer equal to or larger than 0 and smaller than the number of the plurality of the second reception terminals 4b.

By the way, the lower part of FIG. 7 illustrates the second face 8b of the first semiconductor chip 2a. The upper part of FIG. 7 illustrates the second face 8b of the second semiconductor chip 2b. In each of the transmission terminals 6a and 6b of FIG. 7, described is an example of a bit value outputted from each terminal. "bit [0]" in FIG. 7 expresses that a transmission terminal connected thereto with a leader line outputs the 0-th bit of the transmission data. The same descriptions may be applied to bits "bit [1]" to "bit [3]".

Each of cuts in the first and the second semiconductor chips 2a and 2b illustrated in FIG. 7 indicates the rotation angle of each chip. As is apparent from these cuts, the second semiconductor chip 2b is rotated by 90° clockwise relative to the first semiconductor chip 2a in the examples illustrated by FIGS. 6 to 8.

Thus, the second semiconductor chip 2b in the examples illustrated by FIGS. 6 to 8 receives a first reception data "0010" (see FIG. 8). On the other hand, the reference data DS is "0001". Accordingly, the bit-shifting method M1 in the second semiconductor chip 2b is one-bit rightward shift (see FIG. 8). Furthermore, the second semiconductor chip 2b further receives a second reception data "0010" (see FIG. 8). Accordingly, the identification information generating circuit 10 of the second semiconductor chip 2b converts the second reception data "0010" to "0001" by applying one-bit rightward shift to "0010".

Furthermore, the identification information generating circuit 10 of the second semiconductor chip 2b further generates a second identification information "0010" (that is 2) of the second semiconductor chip 2b by adding (giving an increment) 1, which is the certain value, to the converted second reception data "0001".

As described above, the bit-shifting method M1 in the second semiconductor chip 2b is a one-bit rightward shift. Accordingly, the inverse conversion M2 in the second semiconductor chip 2b is a one-bit leftward shift. Thus, the identification information generating circuit 10 of the second semiconductor chip 2b applies one-bit leftward shift (inverse conversion) to the generated identification information "0010" and then outputs the bit sequence 20 ("0100"), identification information to which the one-bit leftward shift (inverse conversion) is applied, from the plurality of the second transmission terminals 6b. The second semiconductor chip 2b further outputs the first reception data "0001" from the plurality of the first transmission terminals 6a.

As described above, in the examples of FIGS. 6 to 8, the second semiconductor chip 2b receives the identification information "0010" of the first semiconductor chip 2a, which has been modified by the rotation of the second semiconductor chip 2b. Then, the identification information generating circuit 10 of the second semiconductor chip 2b firstly removes the influence of rotation from the modified identification information "0010" by applying one-bit rightward-shift M1. As a result, obtained is a correct identification information "0001" of the first semiconductor chip 2a. The identification information generating circuit 10 then adds a constant value "1" to the obtained identification information "0001" so as to generate an identification information "0010" of the second semiconductor chip 2b.

According to the identification information generating circuit 10 of the embodiment 1, as described above, a correct identification information may be obtained because it is possible to eliminate the influence of chip rotation from the identification information that is received from the lower-side semiconductor chip.

Further, in the examples of FIGS. 6 to 8, the second semiconductor chip 2b applies one-bit leftward-shift M2 (inverse conversion) to the generated identification information "0010" and then outputs the one-bit leftward-shifted identification information from the plurality of the second transmission terminals 6b. By this process, the identification information "0010" of the second semiconductor chip 2b undergoes the same modification as the one that the reference data DS undergoes by the rotation of the second semiconductor chip 2b.

Due to the bit-conversion method M1 discussed above, a correct identification information may be easily obtained from the identification information that undergoes the modification identical to the one that the reference data DS undergoes. Accordingly, even when another semiconductor chip is stacked on the second semiconductor chip 2b, a correct identification information may be generated therein.

In the above example, the reference data is "0001". However, the reference data may be a different binary number other than "0001". The reference data D2 may be a binary number having "0" at the least significant bit and "1"s at other bits (i.e., "1110"). That is to say, the reference data in the embodiment 1 may be one-bit hot-clipped binary number (i.e., "0001" or "1110") for example.

When the reference data DS is "1110" and the first reception data D1 includes a bit having a bit value of "0" at the m2-th bit counted from the least significant bit (m2 is an integer), the conversion method M1 (see FIG. 8) means a method that applies an m2-bit rightward-shift to the second reception data D2.

(2) Control Method

Figure 9:
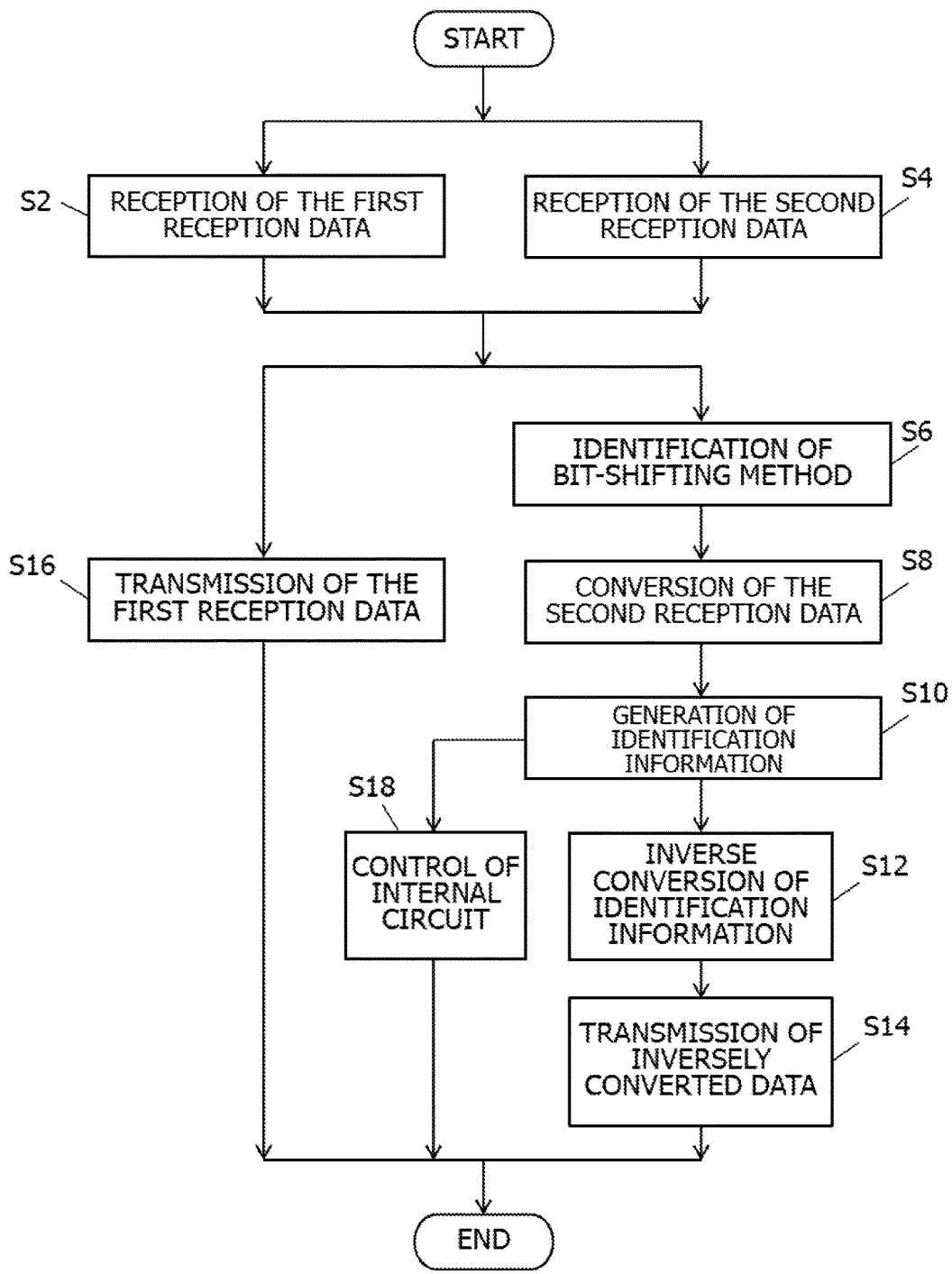
FIG. 9 is a flowchart describing an example of a control method for each semiconductor chip.

FIG. 9 is a flowchart illustrating an example of the control method for the semiconductor chip 102.

The each semiconductor chip 102 first receives a first reception data D1 (see FIG. 8) through the plurality of the first reception terminals 4a (see FIG. 3) (S2). The each semiconductor chip 102 further receives a second reception data D2 through the plurality of the second reception terminals 4b (S4).

The each semiconductor chip 102, after receiving a first reception data D1 (S2), identifies the bit-shifting method M1 (or a data conversion method M1) that enables the first reception data D1 to be converted to the reference data DS (S6).

After receiving (S4) a second reception data D2 and identifying (S6) the bit-shifting method M1, the each semiconductor chip 102 converts the second reception data D2 by the above shifting method M1 (or a data conversion method M1) (S8). Furthermore, the each semiconductor chip 102 generates an identification information ID of the each semiconductor chip 102 based upon the converted second reception data D2 (S10).

The each semiconductor chip 102 converts the generated identification information ID by an inverse shifting method M2 (or inverse conversion method M2) (S12). The inverse shifting method M2 is an inverse conversion method of the above mentioned shifting method M1 (or data conversion method M1). Here, "inverse" means shifting bits (or converting data) with a time sequence that is an inverse of a time sequence (i.e., time sequence for a data conversion) of a case in which bits are shifted by the bit-shifting method M1 (or a data conversion method M1). The each semiconductor chip 102 outputs the inversely-converted identification information ID from the second transmission terminals 6b (S14).

After receiving the first reception data D1 (S2), the each semiconductor chip 102 outputs the received first reception data D1 from the first transmission terminals 6a (S16).

Furthermore, after generating identification information ID (S10), the each semiconductor chip 102 controls an internal circuit 14 included in the each semiconductor chip 102 based upon the generated identification information ID (S18).

As an example, the each semiconductor chip 102 supplies the generated identification information ID to internal circuit 14 and controls data transmission and reception (e.g., transmission and reception by means of I2C (Inter-Integrated Circuit) bus) performed by the internal circuit 14.

The each semiconductor chip may further control an input buffer 28 and an output buffer 30 of the internal circuit 14 (see FIG. 5) based upon the generated identification information ID. More specifically, the signal processing unit 26 of the internal circuit 14 may control the input buffer 28 and the output buffer 30 based upon the identification information ID for example.

FIG. 5 illustrates an example of the control of the input buffer 28 and the output buffer 30. The input buffer 28 represented by a solid line is a buffer in a state of capable of buffering an input signal (i.e., valid state). The input buffers 28 represented by a dashed line is a buffer in a state of incapable of buffering input signal (i.e., invalid state). The same representation is made for output buffers 30.

In the memory of the signal processing unit 26 in FIG. 5, signal paths corresponding to the identification information are recorded. When the identification information is supplied from the identification information generating circuit 10, the signal processing unit 26 reads out from the memory the signal path corresponding to the supplied identification information. The signal processing unit 26 controls the states (valid or invalid) of the input buffers 28 and the output buffers 30 so that the read-out signal path may be formed in the each semiconductor chip 102.

By the way, a broken line 38 in FIG. 5 represents an overall signal path of the semiconductor device 12. In the aforementioned memory of the each semiconductor chip 102, parts of the signal path 38 are recorded (or stored) with being made correspond to the identification information IDs, the parts being obtained by dividing the signal path 38 for the each semiconductor chip. The signal path 38 in FIG. 5 is, for example, a path of a control signal for the each semiconductor chip 102.

An example is described below. In the first semiconductor chip 2a of the first layer, the identification information of 1 (decimal number) is generated by the identification information generating circuit 10 and is supplied to signal processing unit 26. Then, the signal processing unit 26 searches the above described memory using the identification information of 1 as a key and reads out from the memory the signal path that passes through the input buffer 28 on the first face 8a side, the signal processing unit 26 and the output buffer 30 on the second face 8b side.

According to the read-out signal path, the signal processing unit 26 makes valid the input buffer 28 on the first face 8a side and makes invalid the input buffer 28 on the second face 8b side. The signal processing unit 26 further makes invalid the output buffer 30 of the first face 8a side and makes valid the output buffer 30 of the second face 8b side. Thus, the signal path corresponding to the identification information of 1 is formed in the first semiconductor chip 2a.

A similar procedure is performed by the second semiconductor chip 2b of the second layer. Then, a signal path corresponding to the identification information of 2 is formed in the second semiconductor chip 2b. The each signal path formed in the each semiconductor chip is connected to each other through the electrodes 32, 34 and bump 34 of the each semiconductor chip 102 so as to form the signal path passing through the entire semiconductor device 12.

The output of the internal circuit 14 of the second semiconductor chip 2b may be outputted through another signal path (not illustrated), for example. The input buffer 28 and the output buffer 30 may be controlled by another circuit (e.g., the identification information generating circuit 10) other than the signal processing circuit 26.

By the way, as described above, semiconductor chips 102 according to the embodiment 1 are identical in structure. In this case, when the second semiconductor chip 2b is simply stacked on the first semiconductor chip 2a, the output buffer 30 of the first semiconductor chip 2a and the input buffer 28 of the second semiconductor chip 2b are not connected. Accordingly, according to the embodiment 1, as described in FIG. 5, the second semiconductor chip 2b is rotated by 180° relative to the first semiconductor chip 2a to connect the input buffer 28 of the second semiconductor chip 2b and the output buffer 30 of the first semiconductor chip 2a.

The identification information outputted from the first semiconductor chip 2a is modified by this rotation and thereafter received by the second semiconductor chip 2b. However, since the influence of the chip rotation may be eliminated from the modified identification information by means of the identification information generating circuit 10 of the embodiment 1, the second semiconductor chip 2b may generate a correct identification information.

(3) Modification
(3-1) Modification 1

Figure 10A:
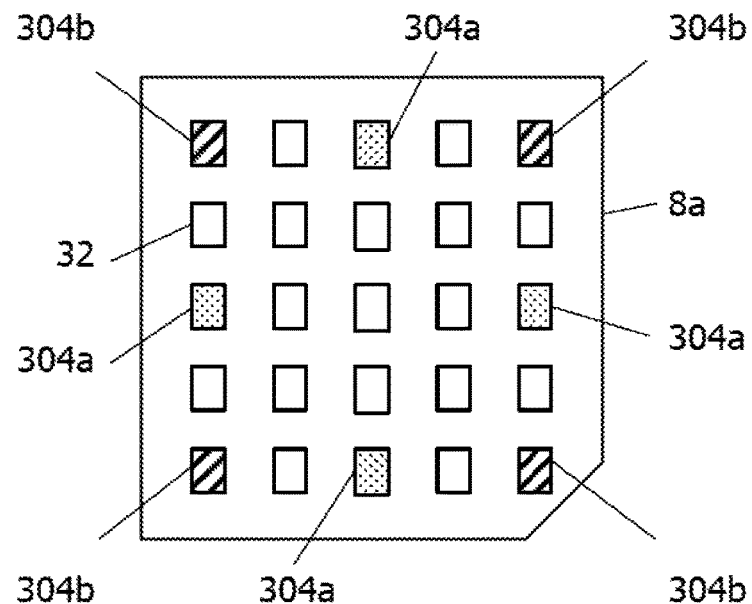
FIG. 10A is a diagram for explaining modification 1 of the embodiment 1.
Figure 10B:
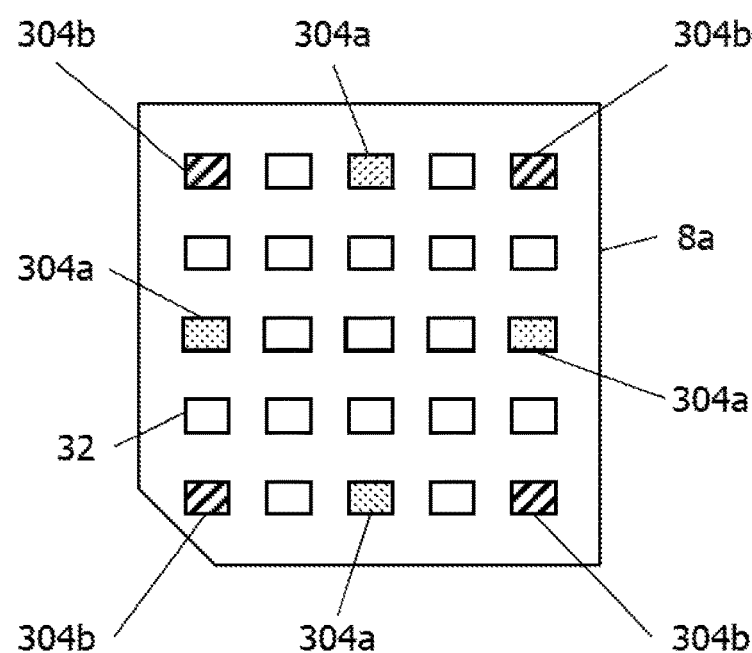
FIG. 10B is a diagram for explaining modification 1 of the embodiment 1.

FIGS. 10A-10B describe a modification 1 of the embodiment 1. FIGS. 10A-10B illustrate the first reception terminals 304a and the second reception terminals 304b of the modification 1. FIG. 10B illustrates the terminals in a state in which FIG. 10B is rotated by 90° relative to FIG. 10A.

Each of the first reception terminals 4a and the second reception terminals 4b of FIG. 3 has a shape of a square. On the other hand, as is seen in FIG. 10 A, each of the first reception terminals 304a and the second reception terminals 304b in modification 1 has a shape of a rectangle.

The plurality of the first reception terminals 4a of FIG. 3 are arranged in point symmetry. However, as is seen in FIGS. 10A-10B, the plurality of the first reception terminals 304a of FIGS. 10A-10B are not arranged in point symmetry. That is to say, the plurality of the first reception terminals 304a of FIG. 10A do not completely lie over the plurality of the first reception terminals 304a of FIG. 10B. For the second reception terminals 304b, the situation is the same.

However, in the example of FIGS. 10A-10B, internal points (for example, center points) each of which is included in one of the plurality of the first reception terminals 304a are arranged in point symmetry. Accordingly, when the second semiconductor chip 2b of the upper layer is rotated, at least a part of the first reception terminals 304a of the second semiconductor chip 2b lies over the first transmission terminals 6a of the first semiconductor chip 2a of the lower layer. For the second reception terminals 304b, the situation is the same.

In the example of FIGS. 10A-10B, the shape of the first reception terminals 304a and the second reception terminals 304b is a rectangle. However, the shape of the first reception terminals 304a and the second reception terminals 304b may be other than a rectangle. As an example, the shape of the first reception terminals 304a and the second reception terminals 304b may be a triangle or a pentagon.

(3-2) Modification 2

Figure 11:
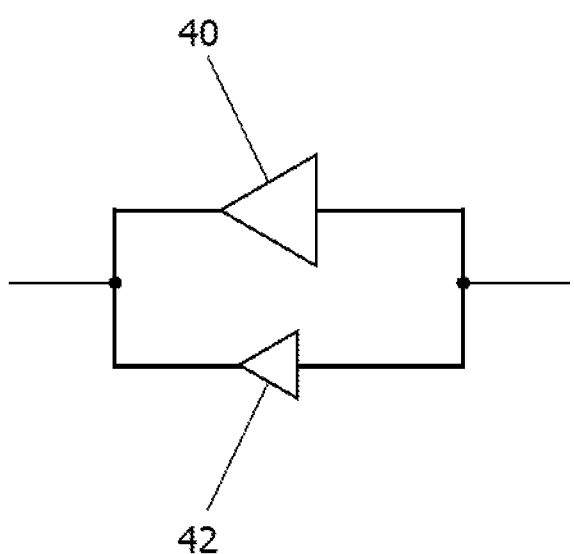
FIG. 11 is a diagram for explaining modification 2.

FIG. 11 is a diagram for illustrating the modification 2.

The each semiconductor chip 102 includes the input buffer 28 (see FIG. 5). This input buffer 28 may be replaced by a buffer circuit 44 in which a large-capacity buffer 40 and a small-capacity buffer 42, capacity of which is smaller than that of the large-capacity buffer 40, are connected in parallel as described in FIG. 11. The large-capacity buffer 40 is compatible, for example, with the C4 (Controlled Collapse Chip Connection). The small-capacity buffer 42 is compatible with a micro-bump. The each semiconductor chip 102 controls this buffer circuit 44 based upon the generated identification information.

As an example, the semiconductor chip 102 makes valid the large-capacity buffer 40 on the selected signal path when the generated identification information is 1. The semiconductor chip 10 further makes invalid the small-capacity buffer 42 of the selected signal path. Through this control, the semiconductor chip 2a on the first layer may be made compatible with the C4 bump. Accordingly, the first semiconductor chip 2a of the first layer may be mounted on a package board through the C4 bump.

On the other hand, the semiconductor chip 102 makes invalid the large-capacity buffer 40 on the selected signal path when the generated identification information is 2. The semiconductor chip 102 further makes valid the small-capacity buffer 42 on the selected signal path. Through this control, the second semiconductor chip 2b of the second layer may be made compatible with the micro-bump.

(3-3) Modification 3

Figure 12:
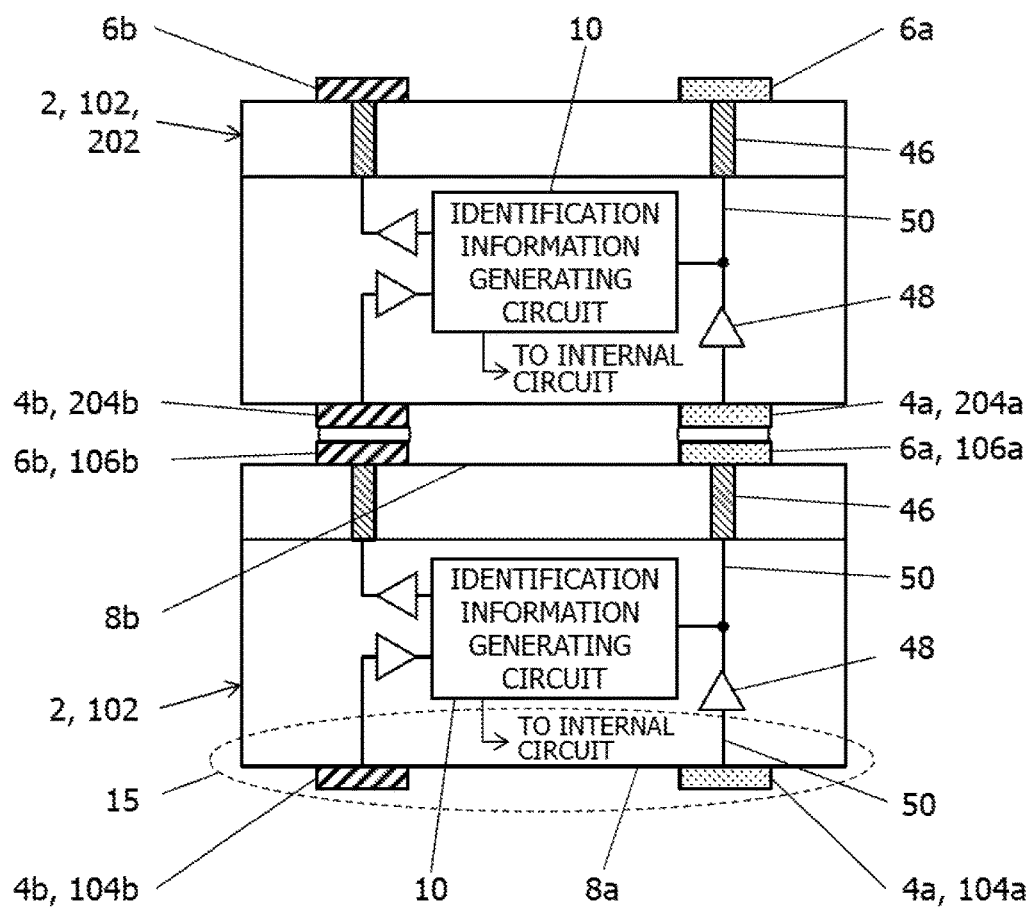
FIG. 12 is a diagram for explaining modification 3.

FIG. 12 is a view for explaining the modification 3.

In the example of FIG. 2, the first reception terminals 4a and the first transmission terminals 6a are connected by a through electrodes 22. However, the first reception terminals 4a and the first transmission terminals 6a may also be connected through a TSV (through-silicon via) 46, a buffer 48 and a wiring 50. According to the modification 3, the first reception data D1 may be amplified.

(3-4) Modification 4

In the example described with reference to FIGS. 6 to 8, the identification information generating circuit 10 generates an identification information by adding a certain value to the converted second reception data D2. However, the identification information generating circuit 10 may generate an identification information by subtracting a certain value from the converted second reception data. In this case, a sufficiently large value (for example, a binary number "1111") may be used as a source of the identification information.

Alternatively, the identification information generating circuit 10 may extract an identification information sequentially from a numerical sequence in which different numbers are arranged in a random sequence. More specifically, the above numerical sequence is recorded in a non-volatile memory of the each semiconductor chip 102. After the second reception data D2 has been converted using the bit-sifting method M1, the identification information generating circuit 10 of the semiconductor chip 102 searches the above numerical sequence to extract a numerical located next to the converted second reception data D2. The each semiconductor chip 102 may use this extracted numerical as its identification information.

Due to the modification 4, variation of the identification information increases.

In the above examples, the semiconductor chip 102 outputs the first reception data D1 from the first transmission terminals 6a and further outputs the identification information converted by the inverse bit-shifting method M2 (or inverse conversion method M2) from the second transmission terminals 6b. However, the semiconductor chip 102 on which another semiconductor chip 202 is not arranged at the second face 8b side may not output these data. As an example, the second semiconductor chip 2b of the second layer of FIG. 2 may not output the first reception data D1 and the inversely-converted identification information.

When other semiconductor chips 202 are not arranged on the second face 8b, there are no semiconductor chips utilizing the first reception data D1 and the inversely-converted identification information. Accordingly, there is no inconveniences even if these data are not outputted.

As described so far, according to the embodiment 1, it is possible to eliminate the influence of the chip rotation from the identification information received from the lower-side semiconductor chip. Thus, the each semiconductor chip of the plurality of the semiconductor chips stacked each together may generate a correct identification information.

Embodiment 2

The embodiment 2 is similar to the embodiment 1. Accordingly, the description of the same portion as in the embodiment 1 will be omitted or be simplified.

Figure 13:
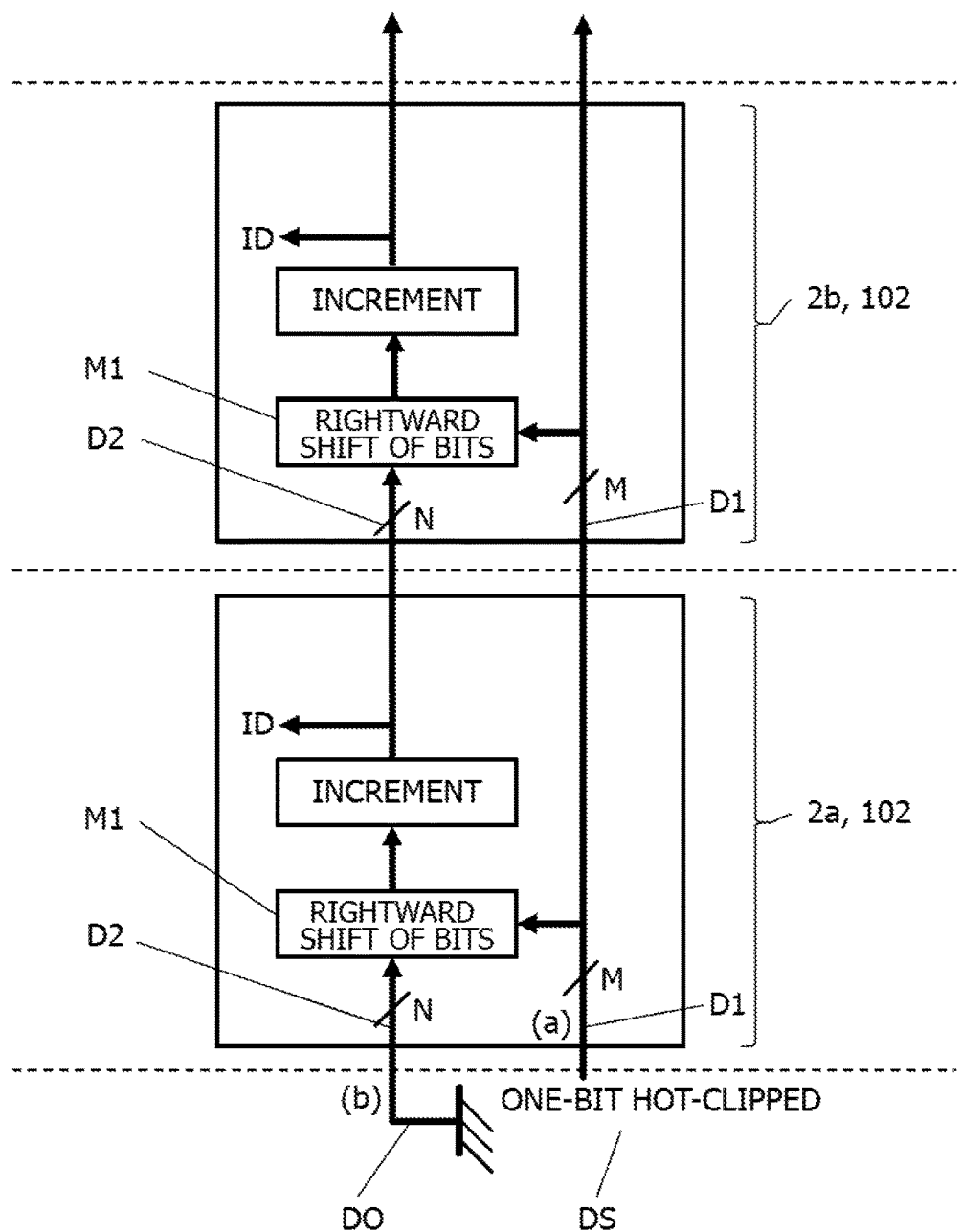
FIG. 13 is an example of a logic connection diagram of the identification information generating circuit of the embodiment 2.
Figure 14:
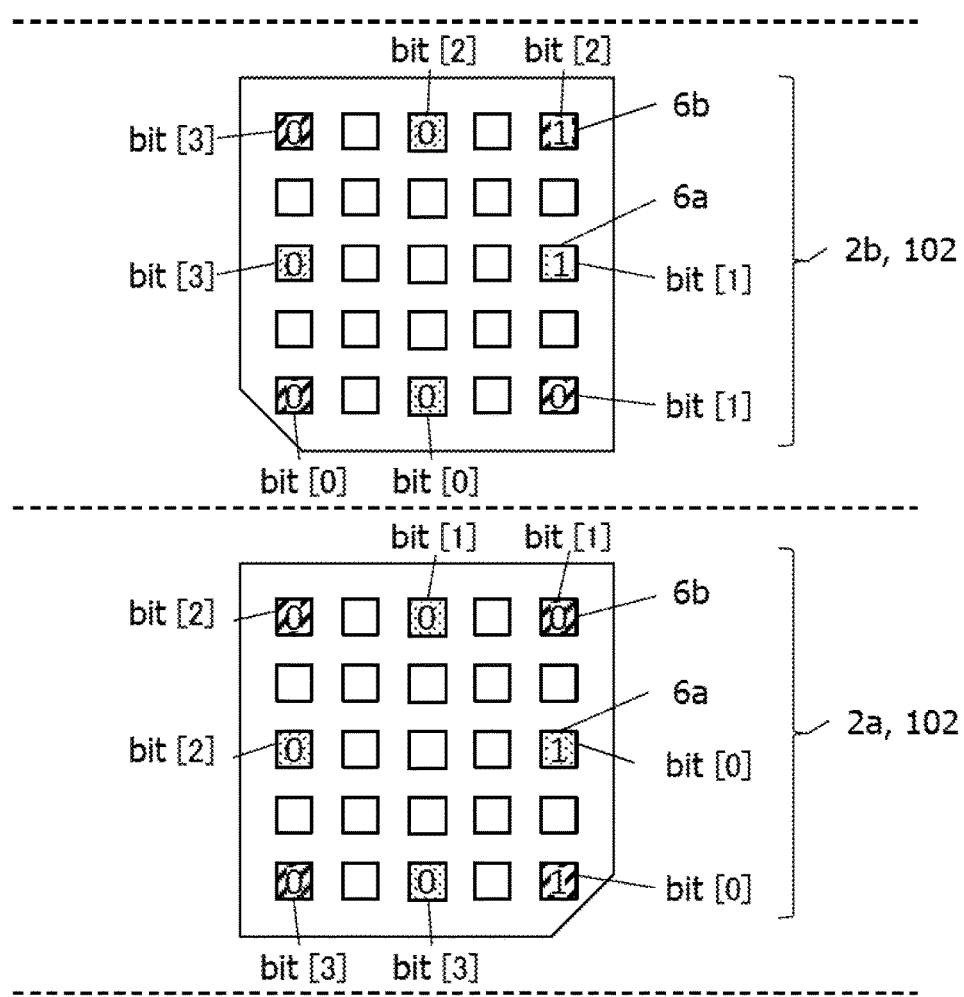
FIG. 14 is an example of the implementation view of the identification information generating circuit of the embodiment 2.
Figure 15:
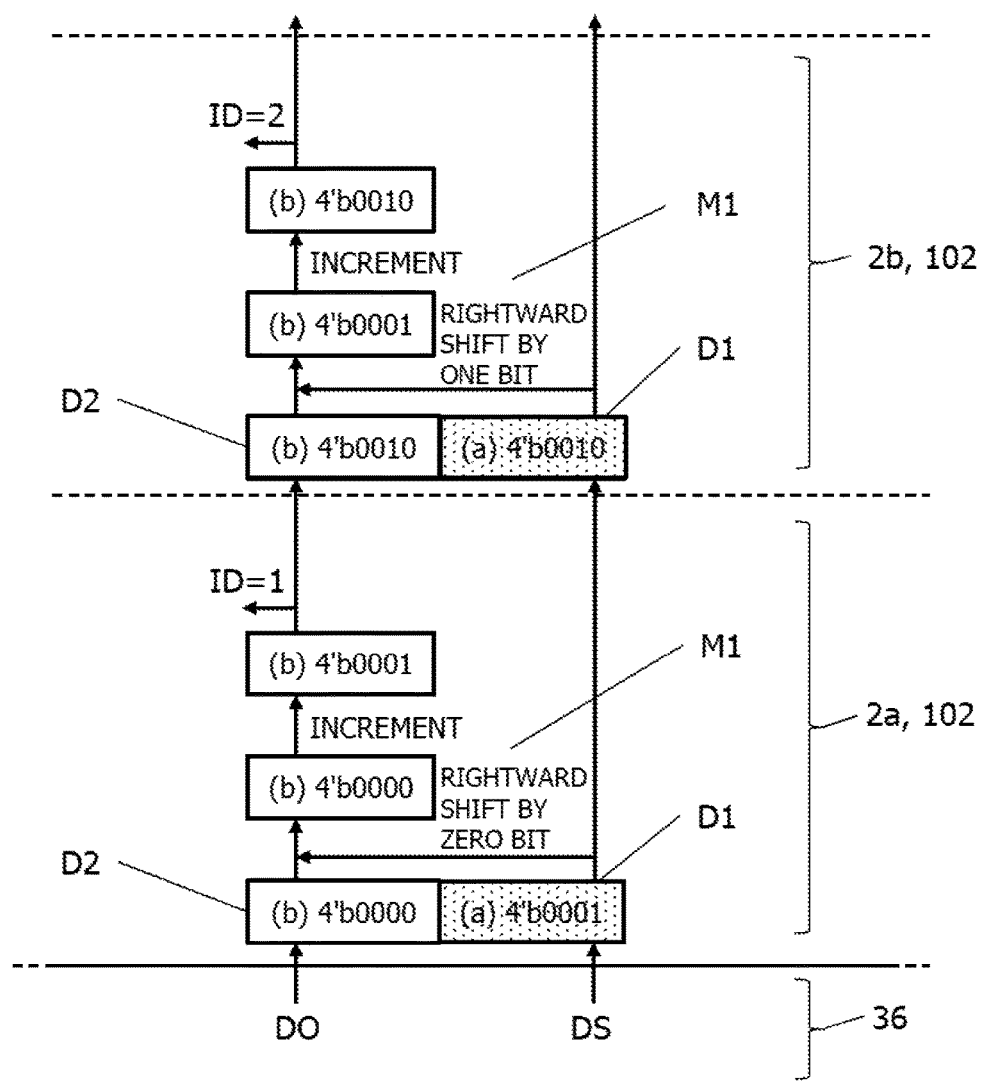
FIG. 15 is a view for explaining an example of signal processing by the identification information generating circuit of the embodiment 2.

FIG. 13 illustrates an example of a logic connection diagram of the identification information generating circuit 10 of the embodiment 2. FIG. 14 illustrates an example of an implementation diagram of the identification information generating circuit 10 of the embodiment 2. FIG. 15 illustrates a view for explaining an example of signal processing performed by the identification information generating circuit 10 of the embodiment 2.

The number of semiconductor chips 102 of the embodiment 2 is two and the same as that in the embodiment 1.

On the other hand, according to the embodiment 2, as illustrated in FIG. 13, the each semiconductor chip 102 directly outputs from the plurality of the second transmission terminals 6b the identification information ID generated by the identification information generating circuit 10, without applying the inverse conversion M2 to the generated identification information ID. In other words, the bit sequence that the each semiconductor chip 102 outputs is just the identification information ID that is generated by the identification information generating circuit 10.

Now let us consider the case where the identification information ID generated by the each semiconductor chip 102 is converted by the inverse conversion M2 (see FIG. 8), which is the inverse conversion of the bit-shifting method M1, as in the case for the embodiment 1. The first reception data D1 received by the first semiconductor chip 2a of the first layer is the reference data DS itself, which is not conversion. Accordingly, in the inverse conversion M2 in the first semiconductor chip 2a of the first layer, non-conversions are performed substantially.

Accordingly, as is described in FIGS. 14 and 15, the identification information ID (e.g., 1) outputted from the first semiconductor chip 2a in the embodiment 2 has the same bit sequence (e.g., 1) as that obtained by applying the inverse conversion M2 to the identification information ID (e. g., 1) (see FIGS. 14 and 15). Consequently, the second semiconductor chip 2b of the second layer may generate a correct identification information ID even when the second semiconductor chip 2b receives the identification information not converted by the inverse conversion M2 from the first semiconductor chip 2a.

Furthermore, the first semiconductor chip 2a may generate a correct identification information regardless of the presence or absence of application of the inverse conversion M2. Thus, according to the embodiment 2, the each semiconductor chip 102 may generate a correct identification information as well as the each semiconductor chip 102 of the embodiment 1.

As described above, the inverse conversion M2 is not applied in the embodiment 2. Accordingly, further simplification in the circuit configuration of the each semiconductor chip 102 may be achieved according to the embodiment 2.

Embodiment 3

The number of semiconductor chips 102, according to embodiment 3, is three. Other structures are almost identical to those of the embodiment 1. Accordingly, the description of the same portion as in the embodiment 1 will be omitted or simplified.

Figure 16:
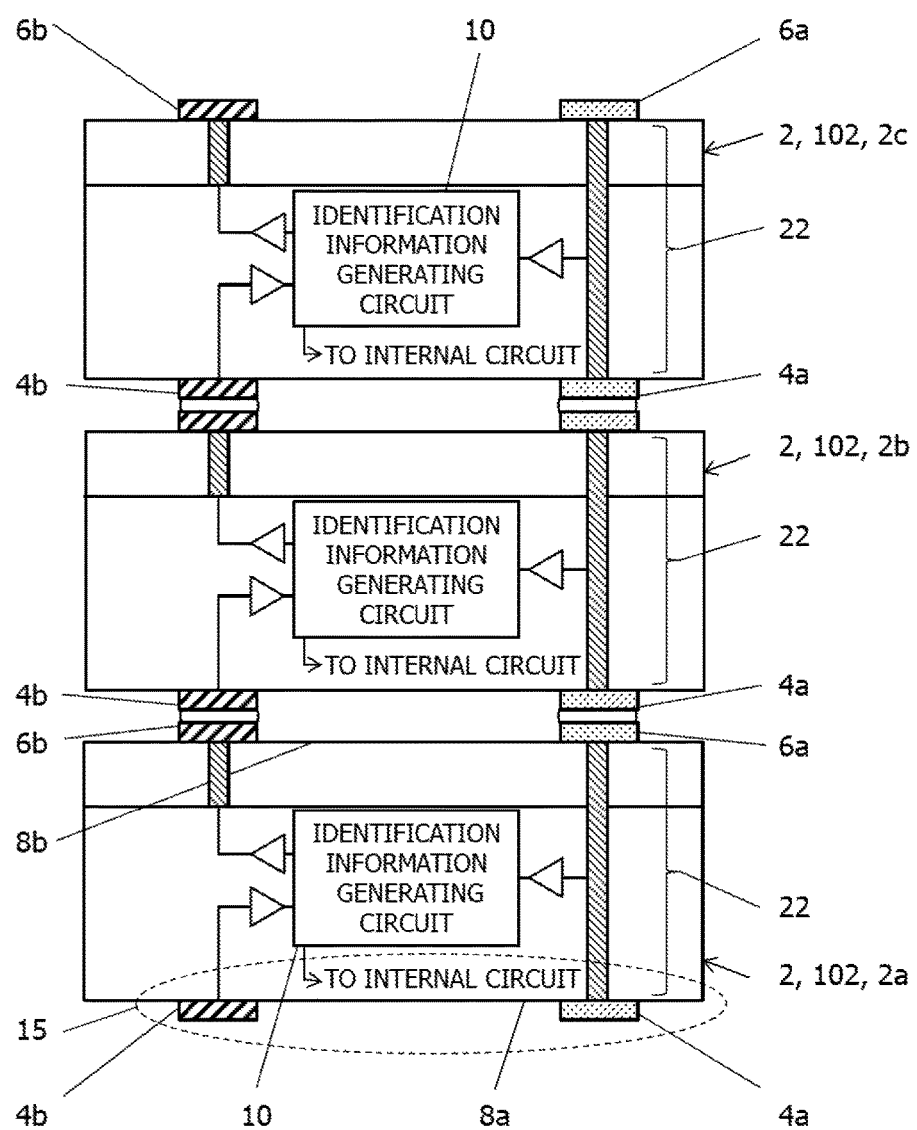
FIG. 16 is a cross-sectional view of the semiconductor device of the embodiment 3.
Figure 17:
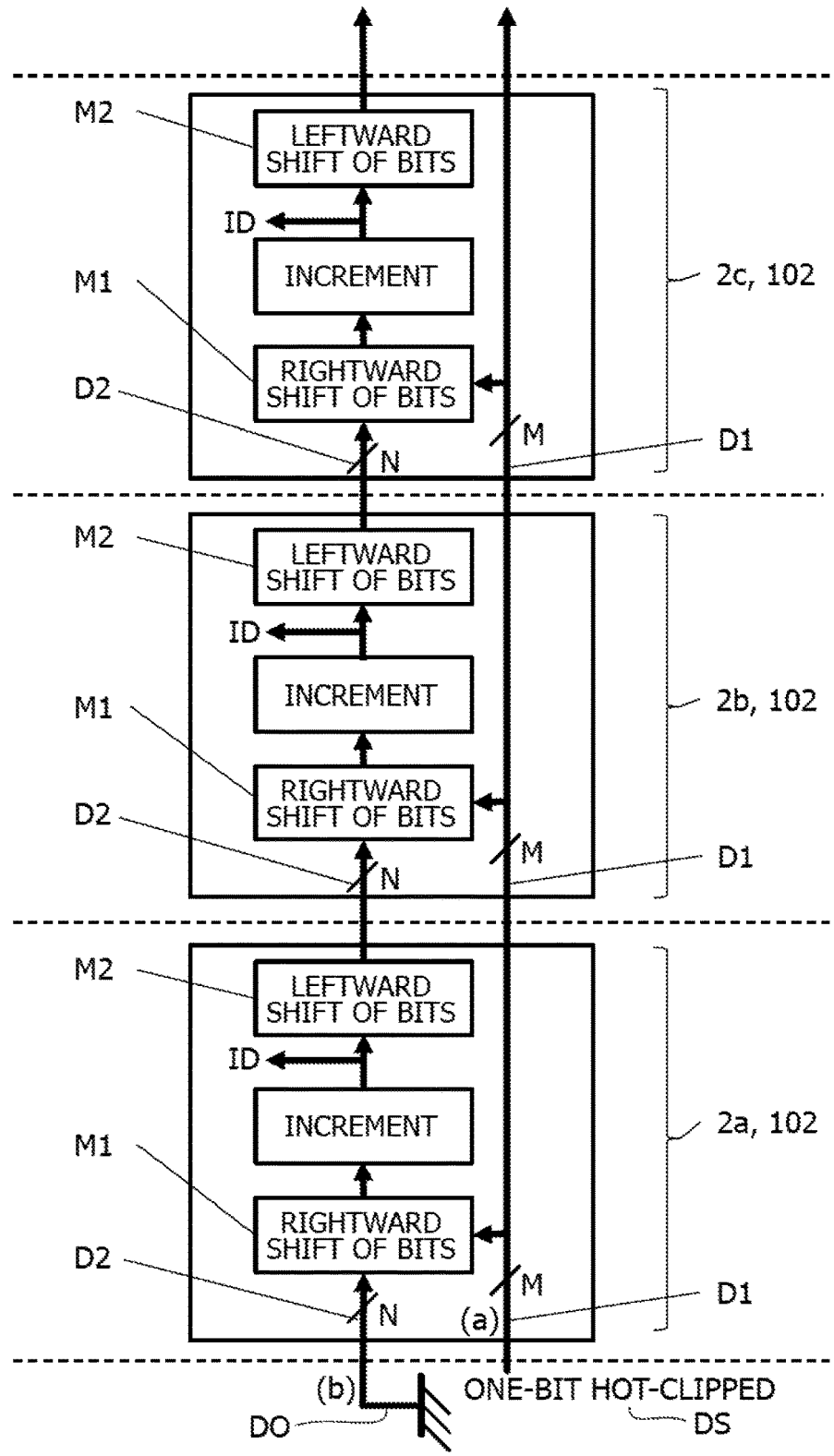
FIG. 17 is an example of a logic connection diagram of the identification information generating circuit of the embodiment 3.
Figure 18:
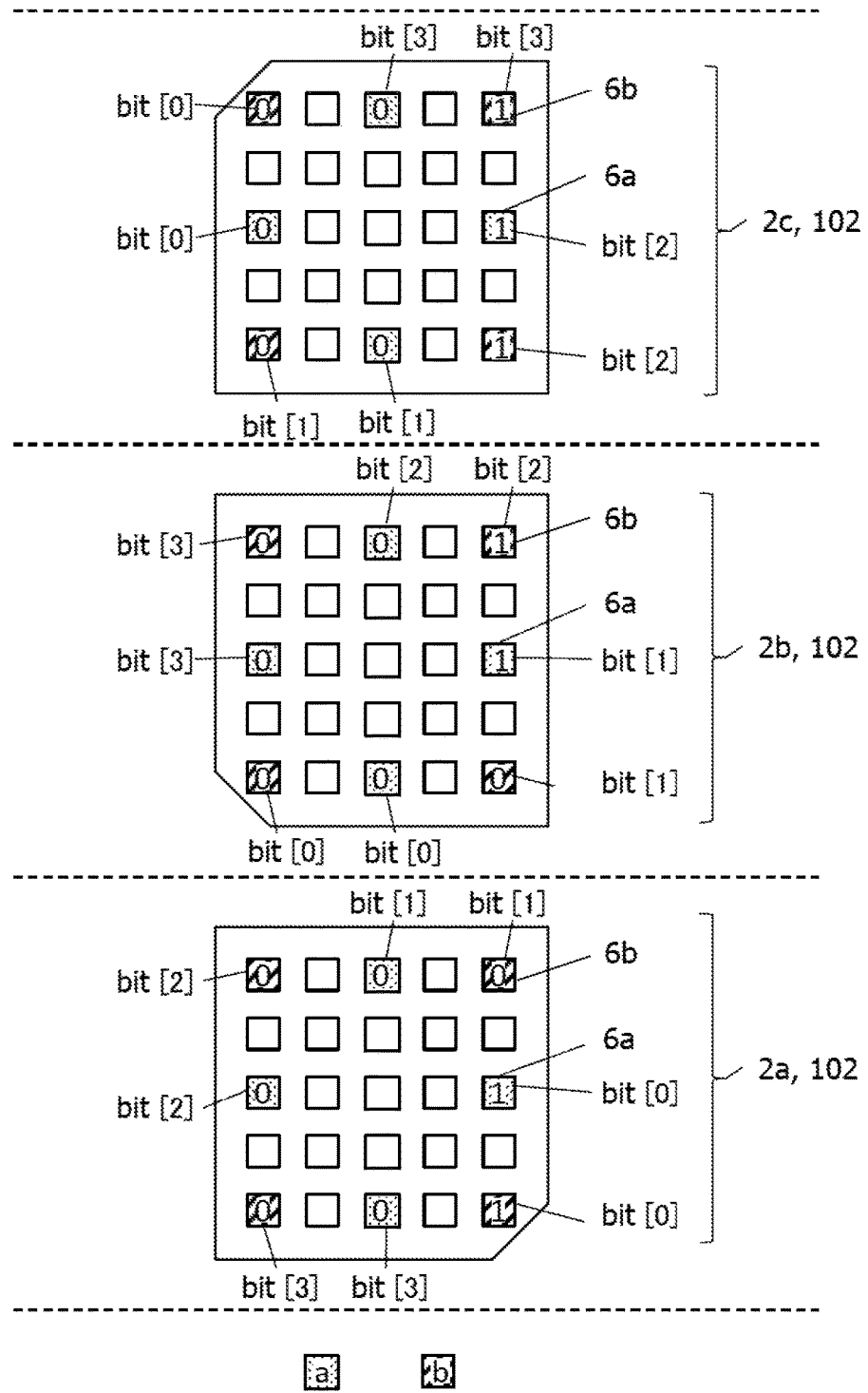
FIG. 18 is an example of the implementation view of the identification information generating circuit of the embodiment 3.
Figure 19:
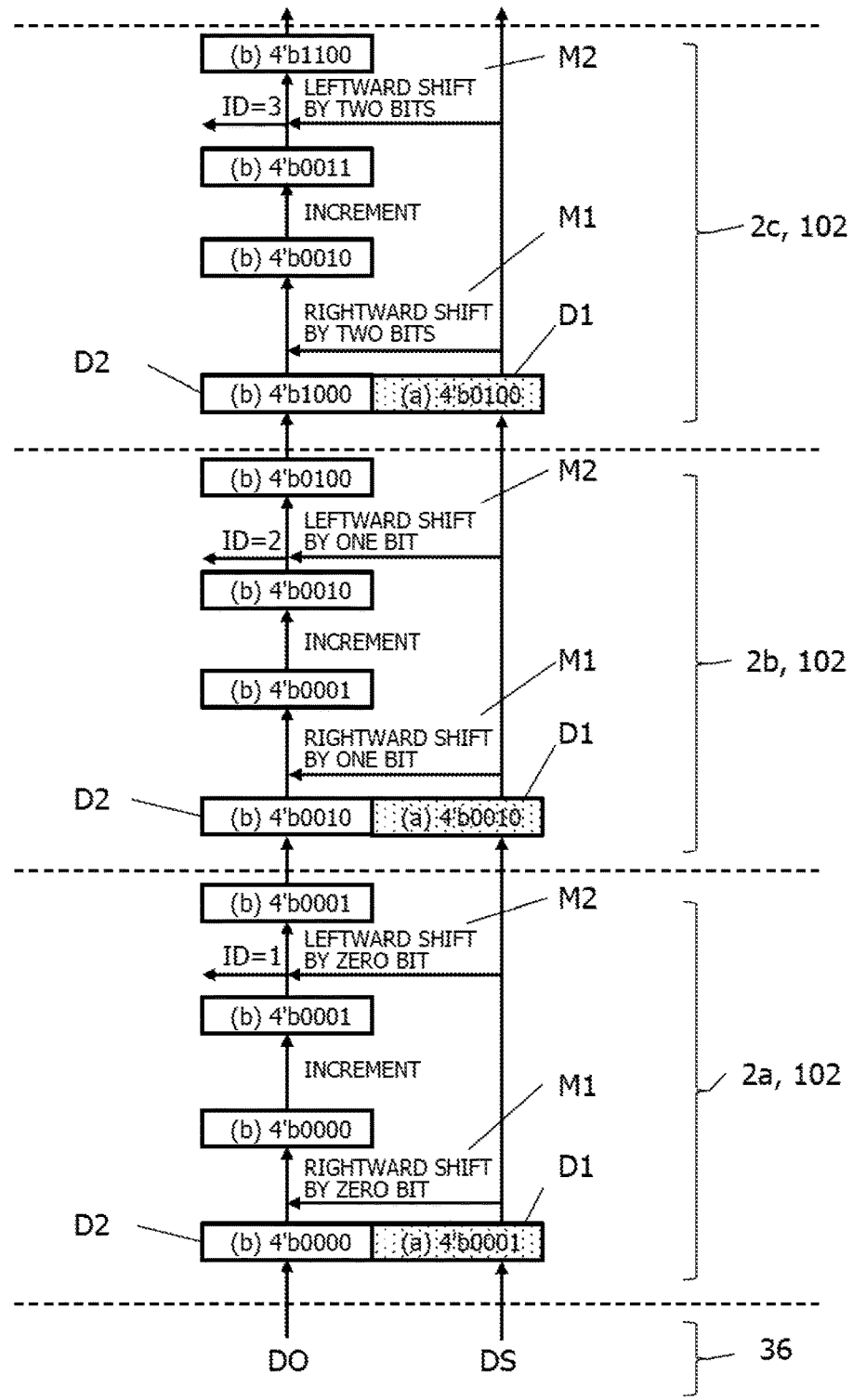
FIG. 19 is a view for explaining an example of signal processing by the identification information generating circuit of the embodiment 3.

FIG. 16 is a cross-sectional view of a semiconductor device 312 according to the embodiment 3. FIG. 16 is an illustration corresponding to FIG. 2 of the embodiment 1. FIG. 17 describes an example of a logic connection diagram of the identification information generating circuit 10 according to the embodiment 3. FIG. 18 is an example of an implementation diagram of the identification information generating circuit 10 according to the embodiment 3. FIG. 19 is a view for explaining an example of the signal processing performed by the identification information generating circuit 10 according to the embodiment 3.

As illustrated in FIGS. 17 to 19, the identification information generating circuit 10 of the embodiment 3 performs the same processing as that of the identification information generating circuit 10 of the embodiment 1. Thus, the each semiconductor chip according to the embodiment 3 may generate a correct identification information, even when the number of semiconductor chips is three.

Figure 20:
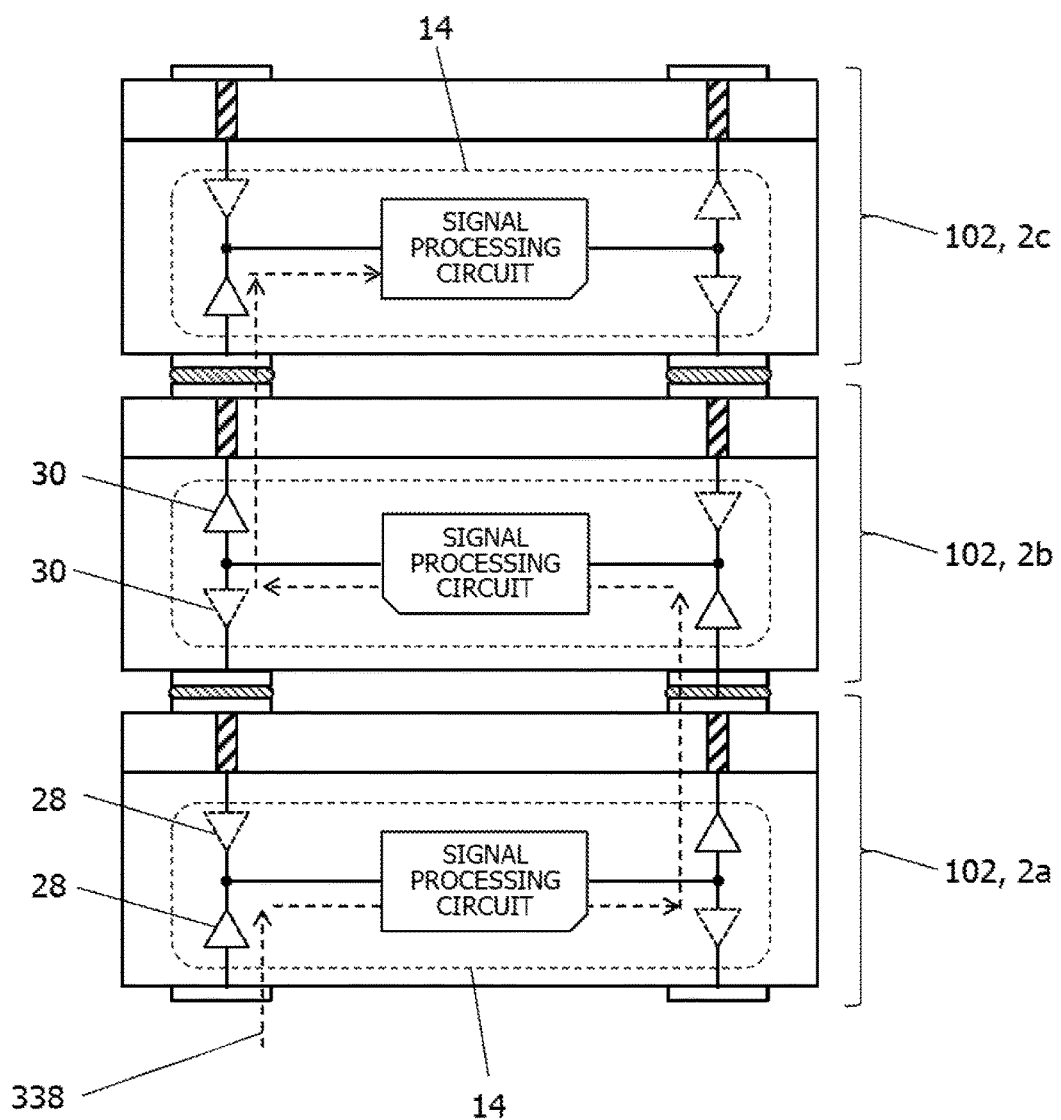
FIG. 20 is a diagram illustrating an example of a signal path to be formed in the semiconductor device of the embodiment 3.

FIG. 20 is a diagram describing an example of a signal path 338 to be formed in semiconductor device 312 according to the embodiment 3. In the example of FIG. 20, the each semiconductor chip 102 is rotated by 180° with respect to the lower-side semiconductor chip.

The each semiconductor chip 102 may form a part of the signal path 338 that passes through the entire semiconductor device 312 based upon the generated identification information, the part being included in the each semiconductor chip 102. Accordingly, according to the embodiment 3, a signal path 338 passing through the entire semiconductor device 312 may be formed even when the number of semiconductor chips is three.

Figure 21:
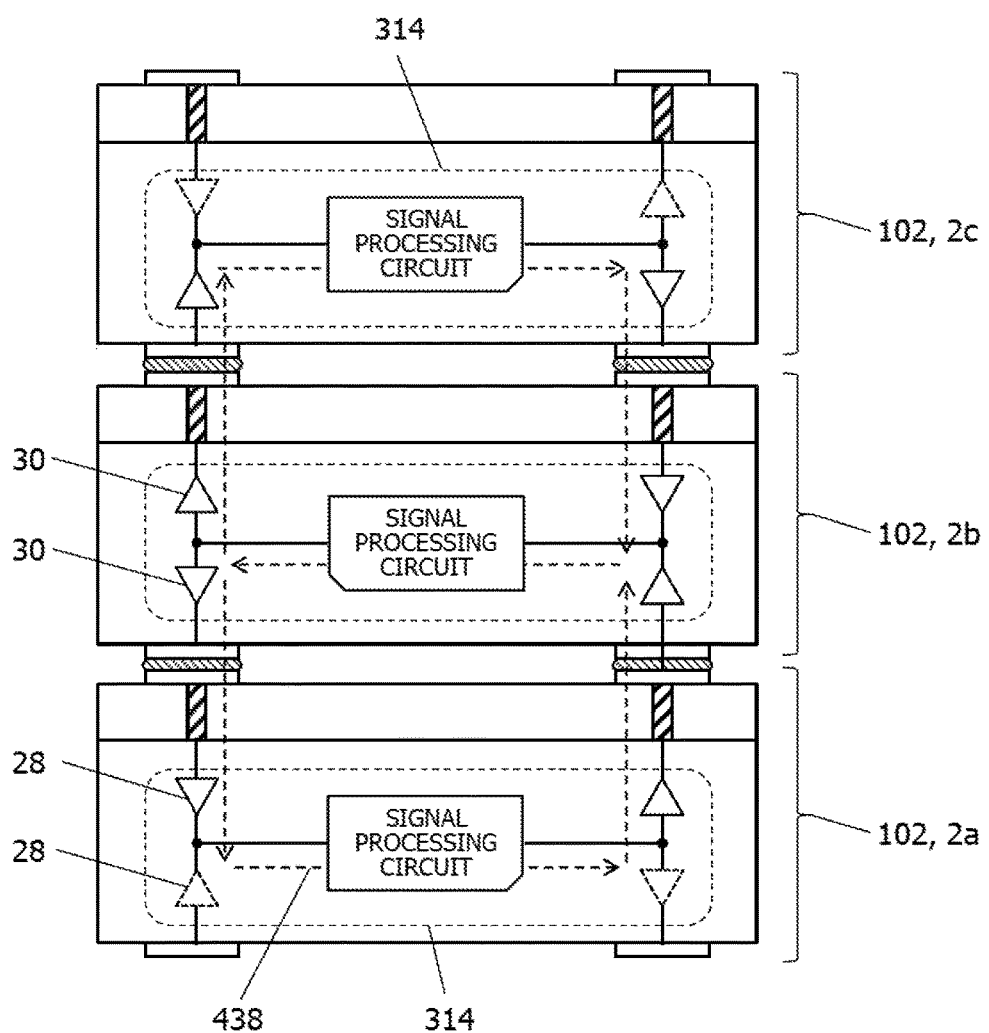
FIG. 21 is a diagram illustrating another example of a signal path to be formed in the semiconductor device of the embodiment 3.

FIG. 21 is a diagram illustrating another example of a signal path 438 to be formed in the semiconductor device 412 according to the embodiment 3. An internal circuit 314 of FIG. 21 is an integrated circuit including, for example, a CPU and a memory. As illustrated in FIG. 21, the semiconductor chips 102 cooperate with one another in order to form signal paths that connect the internal circuit 314 of the second semiconductor chip 2b of the second layer to that of the semiconductor chip 2c located at the upper side and to that of the semiconductor chip 2a located at the lower side. The signal path 438 is a path through which the data generated by the signal processing circuit propagates.

As described so far, according to the embodiment 3, since the number of the semiconductor chips stacked is three, the commonalizing of design and manufacturing process of the semiconductor chip 102 as well as the yield thereof may further be improved. Moreover, the number of the semiconductor chips 102 to be stacked each other may be greater than three.

The semiconductor devices according to the embodiments 1 to 3 may be advantageously employed to produce portable equipment such as a smartphone and information processing devices such as a super computer.

Although the present invention has been described in detail with reference to the exemplary embodiments 1 to 3 of the present invention, these embodiments have been described only for exemplification. The present invention is not limited to these embodiments.

As an example, all the plurality of the semiconductor chips 2 of embodiments 1 to 3 have the same structure. However, some of the plurality of the semiconductor chips 2 may have a different structure from that of other semiconductor chips. Also in this case, it may be possible to commonalize design and manufacturing process for the semiconductor chips having the same structure.

In the above examples, the number of the plurality of the first reception terminals 4a is four. However, the number of the plurality of the first reception terminals 4a may be any number other than four. For example, the number of the plurality of the first reception terminals 4a may be two. The same consideration may be made concerning with the number of the plurality of the second reception terminals 4b.

Further, in the above examples, each of the plurality of the first reception terminals 4a is located near the center of each edge of the each semiconductor chip 102. However each of the plurality of the first reception terminals 4a may be disposed in a different location. For example, the plurality of the first reception terminals 4a may be disposed at each corners of the each semiconductor chip 102. The same consideration may be applied to the plurality of the second reception terminals 4b.

Furthermore, in the above examples, the plurality of the first reception terminals 4a are pad-shaped electrodes. However, the plurality of the first reception terminals 4a are not limited to pad-shaped electrodes. For example, each of the plurality of the first reception terminals 4a may be one end of the through-electrode 22 passing through each semiconductor chip 102. The same consideration may be applied to the plurality of the first transmission terminals 6a, to the plurality of the second reception terminals 4b, and also to the plurality of the second transmission terminals 6b.

Furthermore, in the above examples, the plurality of the first reception terminals 4a are provided on the wiring-layer side of the semiconductor chip. However, the plurality of the first reception terminals 4a may be provided on the substrate side of the semiconductor chip. The same consideration may be applied to the plurality of the second reception terminals 4b.

Furthermore, in the above examples, the identification information generation circuit 10 and the internal circuit 14 are separate circuits. However, the identification information generating circuit 10 and the internal circuit 14 may be of one circuit. For example, the internal circuit 14 may also function as the identification information generation circuit 10. In this case, the processing performed by the identification information generating circuit 10 described above may be performed, for example, by the signal processing circuit 26 of the internal circuit 14.

Furthermore in the above examples, the wiring layer 5 of the each semiconductor chip 102 faces toward the circuit board 36. However, the chip-stacking topology of the each semiconductor chip 102 is not limited to such a topology. For example, the semiconductor substrate 3 of the each semiconductor chip 102 may face toward the circuit board 36.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device in which a plurality of semiconductor chips are stacked, the semiconductor device comprising:
    first reception terminals of the plurality of the semiconductor chips, each of the first reception terminals being arranged in point symmetry on a first face;
    first transmission terminals of the plurality of the semiconductor chips, each of the first transmission terminals being arranged on a second face that is a back face of the first face, and each of the first transmission terminals lying over one of the first reception terminals of the plurality of the semiconductor chips in a plane view; and
    second reception terminals of the plurality of the semiconductor chips, each of the second reception terminals being arranged in point symmetry on the first face, and the second reception terminals being different from the first reception terminals of the plurality of the semiconductor chips;
    each of the plurality of the semiconductor chips includes second transmission terminals of the plurality of the semiconductor chips, the second transmission terminals being arranged on the second face and lying over the second reception terminals of the plurality of the semiconductor chips in a plane view;
    when another semiconductor chip is arranged on the second face, the first transmission terminals of the plurality of the semiconductor chips are connected to the first reception terminals of the another semiconductor chip, and the second transmission terminals of the plurality of the semiconductor chips are connected to the second reception terminals of the another semiconductor chip; and
    a second reception data received by the second reception terminals is converted into data based on a first reception data received by the first reception terminals, and reference data, the reference data being fixed data;
    an identification information of each of the plurality of the semiconductor chips is generated based on the data; and
    a bit sequence based on the identification information is outputted from the second transmission terminals.

2. The semiconductor device according to claim 1, wherein
    the plurality of the semiconductor chips are two in number, and
    each of the plurality of the semiconductor chips outputs the first reception data from the first transmission terminals and further outputs the bit sequence from the second transmission terminals.

3. The semiconductor device according to claim 1, wherein
    the plurality of the semiconductor chips are three or more in number, and
    each of the plurality of the semiconductor chips outputs the first reception data from the first transmission terminals and further converts the generated identification information by the inverse conversion method and then outputs the bit sequence from the second transmission terminals.

4. The semiconductor device according to claim 1, wherein the reference data is a data that changes into different data when a value of each bit thereof is shifted towards a most significant bit side and a binary number overflowed from the most significant bit side is inserted into an empty bit that occurs on a least significant bit side;
    the reference data is inputted into the first reception terminals that are arranged at one end of the semiconductor device; and
    a source of the identification information is inputted into the second reception terminals that is arranged at the one end.

5. The semiconductor device according to claim 1, wherein
    the first reception terminals include a plurality of first points arranged in point symmetry around one point on the first face, and
    the second reception terminals include a plurality of second points arranged in point symmetry around the one point on the first face, the plurality of the second points being different from the plurality of the first points.

6. The semiconductor device according to claim 1, wherein
each of the first reception terminals is an electrode that is provided at one end of a through electrode that passes through one of the plurality of the semiconductor chips, and
each of the first transmission terminals is an electrode that is provided at another end of the through electrode.

7. The semiconductor device according to claim 1, wherein
the reference data is a binary number, a least significant bit thereof being "1" and other bits thereof being "0", and
wherein rightward-shift by m1 bit to the second reception data when the first reception data includes a bit a bit value of which is "1", at m1-th bit counted from a least significant bit, the m1 being an integer.

8. The semiconductor device according to claim 1, wherein
the reference data is a binary number, a least significant bit thereof being "0" and other bits thereof being "1", and
wherein rightward-shift by m2 bit to the second reception data when the first reception data includes a bit a bit value of which is "0", at m2-th bit counted from a least significant bit, the m2 being an integer.

9. The semiconductor device according to claim 1, wherein the generating of the identification information involves adding a certain value or subtracting a certain value and is based on the second reception data.

10. The semiconductor device according to claim 1, wherein each of the plurality of the semiconductor chips includes an internal circuit that operates based upon the identification information.

11. The semiconductor device according to claim 1, wherein
the plurality of the semiconductor chips have one common structure, and
the another semiconductor chip is rotated relative to each of the plurality of the semiconductor chips.

12. The semiconductor device according to claim 1, wherein
an n1-th bit of the first reception data is received at a first terminal of the first reception terminals, n1 being an integer equal to or greater than 0 and smaller than number of the first reception terminals;
an n1-th bit of a data outputted from the first transmission terminals is outputted from a second terminal of the first transmission terminals, the second terminal lying over the first terminal in a plane view;
the n2-th bit of the second reception data is received at a third terminal of the second reception terminals, n2 being an integer equal to or greater than 0 and smaller than number of the second reception terminals; and
an n2-th bit of a data outputted from the second transmission terminals is outputted from a fourth terminal of the second transmission terminals, the fourth terminal lying over the third terminal in a plane view.

13. A method of controlling a semiconductor device that includes a plurality of semiconductor chips that are stacked and further includes: first reception terminals of the plurality of the semiconductor chips, each of the first reception terminals being arranged in point symmetry on a first face; first transmission terminals of the plurality of the semiconductor chips, each of the first transmission terminals being arranged on a second face that is a back face of the first face, and each of the first transmission terminals lying over one of the first reception terminals of the plurality of the semiconductor chips in a plane view; and second reception terminals of the plurality of the semiconductor chips, each of the second reception terminals being arranged in point symmetry on the first face and the second reception terminals being different from the first reception terminals of the plurality of the semiconductor chips; each of the plurality of the semiconductor chips includes second transmission terminals of the plurality of the semiconductor chips, the second transmission terminals being arranged on the second face and lying over the second reception terminals of the plurality of the semiconductor chips in a plane view; and when another semiconductor chip is arranged on the second face, the first transmission terminals of the plurality of the semiconductor chips are connected to the first reception terminals of the another semiconductor chip, and the second transmission terminals of the plurality of the semiconductor chips are connected to the second reception terminals of the another semiconductor chip; the method comprising:
converting a second reception data received by the second reception terminals into data based on a first reception data received by the first reception terminals, and reference data, the reference data being fixed data;
generating an identification information of each of the plurality of the semiconductor chips based on the data; and
outputting a bit sequence based on the identification information from the second transmission terminals.

* * * * *